(12) United States Patent
Yamazaki et al.

(10) Patent No.: US 9,653,519 B2
(45) Date of Patent: May 16, 2017

(54) LIGHT EMITTING DEVICE, METHOD OF PREPARING THE SAME AND DEVICE FOR FABRICATING THE SAME

(71) Applicant: Semiconductor Energy Laboratory Co., Ltd., Kanagawa-ken (JP)

(72) Inventors: Shunpei Yamazaki, Tokyo (JP); Masaaki Hiroki, Kanagawa (JP); Masakazu Murakami, Kanagawa (JP); Hideaki Kuwabara, Kanagawa (JP)

(73) Assignee: Semiconductor Energy Laboratory Co., Ltd. (JP)

(*) Notice: Subject to any disclaimer, the term of this patent is extended or adjusted under 35 U.S.C. 154(b) by 0 days.

(21) Appl. No.: 14/989,195

(22) Filed: Jan. 6, 2016

(65) Prior Publication Data

US 2016/0118445 A1  Apr. 28, 2016

Related U.S. Application Data

(60) Continuation of application No. 14/153,362, filed on Jan. 13, 2014, now Pat. No. 9,236,418, which is a
(Continued)

(30) Foreign Application Priority Data

Jan. 24, 2002 (JP) ................. 2002-016244

(51) Int. Cl.
*H01L 51/00* (2006.01)
*H01L 29/08* (2006.01)
(Continued)

(52) U.S. Cl.
CPC .......... *H01L 27/3211* (2013.01); *H01L 27/32* (2013.01); *H01L 27/3246* (2013.01);
(Continued)

(58) Field of Classification Search
CPC ............. H01L 51/5228; H01L 27/3246; H01L 27/3211; H01L 27/3258; H01L 27/32;
(Continued)

(56) References Cited

U.S. PATENT DOCUMENTS 4,871,236 A  10/1989  Gemma et al.
4,971,919 A  11/1990  Yamazaki
(Continued)

FOREIGN PATENT DOCUMENTS

EP  0 845 924 A2  6/1998
EP  0 940 797 A1  9/1999
(Continued)

*Primary Examiner* — Jesse Y Miyoshi
(74) *Attorney, Agent, or Firm* — Husch Blackwell LLP

(57) ABSTRACT

A light emitting device having a high definition, a high aperture ratio and a high reliability is provided. The present invention realizes a high definition and a high aperture ratio for a flat panel display of full colors using luminescent colors of red, green and blue without being dependent upon the film formation method and deposition precision of an organic compound layer by forming the laminated sections 21, 22 by means of intentionally and partially overlapping different organic compound layers of adjacent light emitting elements. Moreover, the protective film 32a containing hydrogen is formed and the drawback in the organic compound layer is terminated with hydrogen, thereby realizing the enhancement of the brightness and the reliability.

18 Claims, 14 Drawing Sheets

Related U.S. Application Data continuation of application No. 11/476,508, filed on Jun. 28, 2006, now Pat. No. 8,629,439, which is a division of application No. 10/349,750, filed on Jan. 22, 2003, now Pat. No. 7,098,069.

(51) Int. Cl.
*H01L 27/32* (2006.01)
*H01L 51/52* (2006.01)

(52) U.S. Cl.
CPC ...... *H01L 27/3258* (2013.01); *H01L 51/5228* (2013.01); *H01L 51/5253* (2013.01); *H01L 27/322* (2013.01); *H01L 51/5234* (2013.01); *H01L 51/5281* (2013.01)

(58) Field of Classification Search
CPC ............... H01L 27/322; H01L 51/5234; H01L 51/5281; H01L 51/5253
See application file for complete search history.

(56) References Cited

U.S. PATENT DOCUMENTS

| | | | |
|---|---|---|---|
| 5,478,777 A | 12/1995 | Yamazaki | |
| 5,677,546 A | 10/1997 | Yu | |
| 5,682,043 A | 10/1997 | Pei et al. | |
| 5,920,080 A | 7/1999 | Jones | |
| 5,929,474 A | 7/1999 | Huang et al. | |
| 5,970,318 A | 10/1999 | Choi et al. | |
| 6,013,384 A | 1/2000 | Kido et al. | |
| 6,066,518 A | 5/2000 | Yamazaki | |
| 6,107,734 A | 8/2000 | Tanaka et al. | |
| 6,198,091 B1 | 3/2001 | Forrest et al. | |
| 6,198,092 B1 | 3/2001 | Bulovic et al. | |
| 6,208,077 B1 | 3/2001 | Hung | |
| 6,278,055 B1 | 8/2001 | Forrest et al. | |
| 6,284,393 B1 | 9/2001 | Hosokawa et al. | |
| 6,288,486 B1 | 9/2001 | Tsuruoka et al. | |
| 6,297,495 B1 | 10/2001 | Bulovic et al. | |
| 6,352,777 B1 | 3/2002 | Bulovic et al. | |
| 6,366,016 B1 | 4/2002 | Sakaguchi et al. | |
| 6,366,025 B1 | 4/2002 | Yamada | |
| 6,380,672 B1 | 4/2002 | Yudasaka | |
| 6,392,340 B2 | 5/2002 | Yoneda et al. | |
| 6,420,834 B2 | 7/2002 | Yamazaki et al. | |
| 6,423,429 B2 | 7/2002 | Kido et al. | |
| 6,429,584 B2 | 8/2002 | Kubota | |
| 6,445,005 B1 | 9/2002 | Yamazaki et al. | |
| 6,451,415 B1 | 9/2002 | Forrest et al. | |
| 6,452,092 B2 | 9/2002 | Han et al. | |
| 6,475,845 B2 | 11/2002 | Kimura | |
| 6,479,838 B2 | 11/2002 | Morosawa | |
| 6,489,176 B2 | 12/2002 | Ninomiya | |
| 6,489,631 B2 | 12/2002 | Young et al. | |
| 6,522,066 B2 | 2/2003 | Sheu et al. | |
| 6,524,884 B1 | 2/2003 | Kim et al. | |
| 6,538,374 B2 * | 3/2003 | Hosokawa .......... H01L 27/3244 313/503 | |
| 6,567,146 B2 | 5/2003 | Hirakata et al. | |
| 6,580,213 B2 | 6/2003 | Yamazaki | |
| 6,580,214 B2 | 6/2003 | Yoneda et al. | |
| 6,593,691 B2 | 7/2003 | Nishi et al. | |
| 6,605,826 B2 | 8/2003 | Yamazaki et al. | |
| 6,614,174 B1 | 9/2003 | Urabe et al. | |
| 6,641,933 B1 | 11/2003 | Yamazaki et al. | |
| 6,642,651 B2 | 11/2003 | Yudasaka | |
| 6,656,519 B2 | 12/2003 | Sakaguchi et al. | |
| 6,689,492 B1 | 2/2004 | Yamazaki et al. | |
| 6,692,820 B2 | 2/2004 | Forrest et al. | |
| 6,720,198 B2 | 4/2004 | Yamagata et al. | |
| 6,768,259 B2 | 7/2004 | Hirano | |
| 6,781,152 B2 | 8/2004 | Yamazaki | |
| 6,781,162 B2 | 8/2004 | Yamazaki et al. | |
| 6,812,637 B2 | 11/2004 | Cok et al. | |
| 6,815,723 B2 | 11/2004 | Yamazaki et al. | |
| 6,828,727 B2 | 12/2004 | Yamazaki | |
| 6,833,560 B2 | 12/2004 | Konuma et al. | |
| 6,844,025 B2 | 1/2005 | Forrest et al. | |
| 6,849,877 B2 | 2/2005 | Yamazaki et al. | |
| 6,864,629 B2 | 3/2005 | Miyaguchi et al. | |
| 6,867,430 B2 | 3/2005 | Kato et al. | |
| 6,882,102 B2 | 4/2005 | Yamazaki | |
| 6,885,148 B2 | 4/2005 | Yudasaka | |
| 6,894,312 B2 | 5/2005 | Yamazaki et al. | |
| 6,936,485 B2 | 8/2005 | Yamazaki et al. | |
| 6,958,489 B2 | 10/2005 | Kimura | |
| 6,969,291 B2 | 11/2005 | Urabe et al. | |
| 7,012,290 B2 | 3/2006 | Kimura | |
| 7,015,503 B2 | 3/2006 | Seki et al. | |
| 7,112,374 B2 | 9/2006 | Yamazaki et al. | |
| 7,113,154 B1 | 9/2006 | Inukai | |
| 7,119,364 B2 | 10/2006 | Yamazaki | |
| 7,129,102 B2 | 10/2006 | Yamazaki | |
| 7,132,693 B2 | 11/2006 | Konuma et al. | |
| 7,214,959 B2 | 5/2007 | Seki et al. | |
| 7,268,851 B2 | 9/2007 | Hirakata et al. | |
| 7,273,801 B2 | 9/2007 | Seki et al. | |
| 7,283,185 B2 | 10/2007 | Hirakata et al. | |
| 7,364,939 B2 | 4/2008 | Yudasaka | |
| 7,411,211 B1 | 8/2008 | Yamazaki | |
| 7,420,208 B2 | 9/2008 | Yamazaki et al. | |
| 7,442,955 B2 | 10/2008 | Seki et al. | |
| 7,468,285 B2 | 12/2008 | Yamazaki et al. | |
| 7,473,928 B1 | 1/2009 | Yamazaki et al. | |
| 7,518,146 B2 | 4/2009 | Yamazaki et al. | |
| 7,579,203 B2 | 8/2009 | Yamazaki et al. | |
| 7,592,652 B2 | 9/2009 | Kimura | |
| 7,732,824 B2 | 6/2010 | Konuma et al. | |
| 7,915,816 B2 * | 3/2011 | Kashiwabara ...... H01L 51/5203 313/503 | |
| 7,932,518 B2 | 4/2011 | Seki et al. | |
| 7,952,103 B2 | 5/2011 | Yamazaki et al. | |
| 8,158,992 B2 | 4/2012 | Konuma et al. | |
| 8,159,124 B2 | 4/2012 | Yudasaka | |
| 8,183,571 B2 | 5/2012 | Yamazaki et al. | |
| 8,450,745 B2 | 5/2013 | Yamazaki et al. | |
| 2001/0031509 A1 | 10/2001 | Yamazaki | |
| 2001/0043043 A1 | 11/2001 | Aoyama et al. | |
| 2001/0043046 A1 | 11/2001 | Fukunaga | |
| 2001/0046611 A1 | 11/2001 | Kido et al. | |
| 2001/0053559 A1 | 12/2001 | Nagao et al. | |
| 2002/0021268 A1 | 2/2002 | Yamazaki et al. | |
| 2002/0057055 A1 | 5/2002 | Yamazaki et al. | |
| 2002/0079512 A1 | 6/2002 | Yamazaki et al. | |
| 2002/0119297 A1 | 8/2002 | Forrest et al. | |
| 2002/0125817 A1 | 9/2002 | Yamazaki et al. | |
| 2002/0158835 A1 | 10/2002 | Kobayashi et al. | |
| 2002/0189666 A1 | 12/2002 | Forrest et al. | |
| 2002/0197462 A1 | 12/2002 | Forrest et al. | |
| 2003/0042846 A1 | 3/2003 | Forrest et al. | |
| 2003/0089913 A1 | 5/2003 | Takayama et al. | |
| 2003/0122140 A1 | 7/2003 | Yamazaki et al. | |
| 2003/0137325 A1 | 7/2003 | Yamazaki et al. | |
| 2003/0155573 A1 | 8/2003 | Yamazaki et al. | |
| 2003/0209974 A1 | 11/2003 | Yamazaki | |
| 2003/0218166 A1 | 11/2003 | Tsutsui | |
| 2003/0219928 A1 | 11/2003 | Kato et al. | |
| 2004/0003939 A1 | 1/2004 | Nishi et al. | |
| 2004/0027059 A1 | 2/2004 | Tsutsui | |
| 2004/0027061 A1 | 2/2004 | Seo et al. | |
| 2004/0113546 A1 | 6/2004 | Forrest et al. | |
| 2004/0151887 A1 | 8/2004 | Forrest et al. | |
| 2005/0012105 A1 | 1/2005 | Yamazaki et al. | |
| 2005/0012445 A1 | 1/2005 | Yamazaki et al. | |
| 2005/0045917 A1 | 3/2005 | Yamazaki et al. | |
| 2006/0180826 A1 | 8/2006 | Yamazaki et al. | |
| 2007/0007870 A1 | 1/2007 | Yamazaki et al. | |
| 2007/0082430 A1 | 4/2007 | Yamazaki | |
| 2009/0298210 A1 | 12/2009 | Yamazaki et al. | |
| 2009/0315066 A1 | 12/2009 | Kimura | |

(56) References Cited

U.S. PATENT DOCUMENTS

| | | |
|---|---|---|
| 2012/0199853 A1 | 8/2012 | Konuma et al. |
| 2013/0313558 A1 | 11/2013 | Yamazaki et al. |

FOREIGN PATENT DOCUMENTS

| | | |
|---|---|---|
| EP | 0 989 778 A1 | 3/2000 |
| EP | 1 026 757 A2 | 8/2000 |
| EP | 1 085 576 A2 | 3/2001 |
| EP | 1 087 448 A2 | 3/2001 |
| EP | 1 093 166 A2 | 4/2001 |
| EP | 1 102 317 A2 | 5/2001 |
| EP | 1 103 946 A2 | 5/2001 |
| EP | 1 119 221 A2 | 7/2001 |
| EP | 1 119 222 A2 | 7/2001 |
| EP | 1 122 794 A2 | 8/2001 |
| EP | 1 128 436 A1 | 8/2001 |
| EP | 1 139 454 A2 | 10/2001 |
| EP | 1 376 713 A2 | 1/2004 |
| EP | 1 505 648 A2 | 2/2005 |
| EP | 1 793 650 A2 | 6/2007 |
| EP | 2 259 322 A2 | 12/2010 |
| JP | 05-101886 A | 4/1993 |
| JP | 05-108014 A | 4/1993 |
| JP | 10-162959 A | 6/1998 |
| JP | 10-189252 A | 7/1998 |
| JP | 11-067454 A | 3/1999 |
| JP | 11-214157 A | 8/1999 |
| JP | 11-251059 A | 9/1999 |
| JP | 2000-077191 A | 3/2000 |
| JP | 2000-091082 A | 3/2000 |
| JP | 2000-123975 A | 4/2000 |
| JP | 2000-150171 A | 5/2000 |
| JP | 2000-195677 A | 7/2000 |
| JP | 2000-208253 A | 7/2000 |
| JP | 2000-223264 A | 8/2000 |
| JP | 2000-268978 A | 9/2000 |
| JP | 2000-353594 A | 12/2000 |
| JP | 2000-357584 A | 12/2000 |
| JP | 2001-148291 A | 5/2001 |
| JP | 2001-189192 A | 7/2001 |
| JP | 2001-196174 A | 7/2001 |
| JP | 2001-214159 A | 8/2001 |
| JP | 2001-217072 A | 8/2001 |
| JP | 2001-284041 A | 10/2001 |
| JP | 2001-290439 A | 10/2001 |
| JP | 2001-312223 A | 11/2001 |
| JP | 2001-319776 A | 11/2001 |
| JP | 2001-319789 A | 11/2001 |
| JP | 2001-343911 A | 12/2001 |
| JP | 2001-343933 A | 12/2001 |
| JP | 2001-345180 A | 12/2001 |
| JP | 2001-356711 A | 12/2001 |
| JP | 2002-015861 A | 1/2002 |
| JP | 2002-508108 | 3/2002 |
| JP | 2002-216960 A | 8/2002 |
| JP | 2003-197371 A | 7/2003 |
| WO | WO 98/59528 A1 | 12/1998 |
| WO | WO 99/10862 A1 | 3/1999 |

* cited by examiner

A-A' CROSS-SECTIONAL VIEW

B-B' SECTIONAL VIEW

C-C' SECTIONAL VIEW

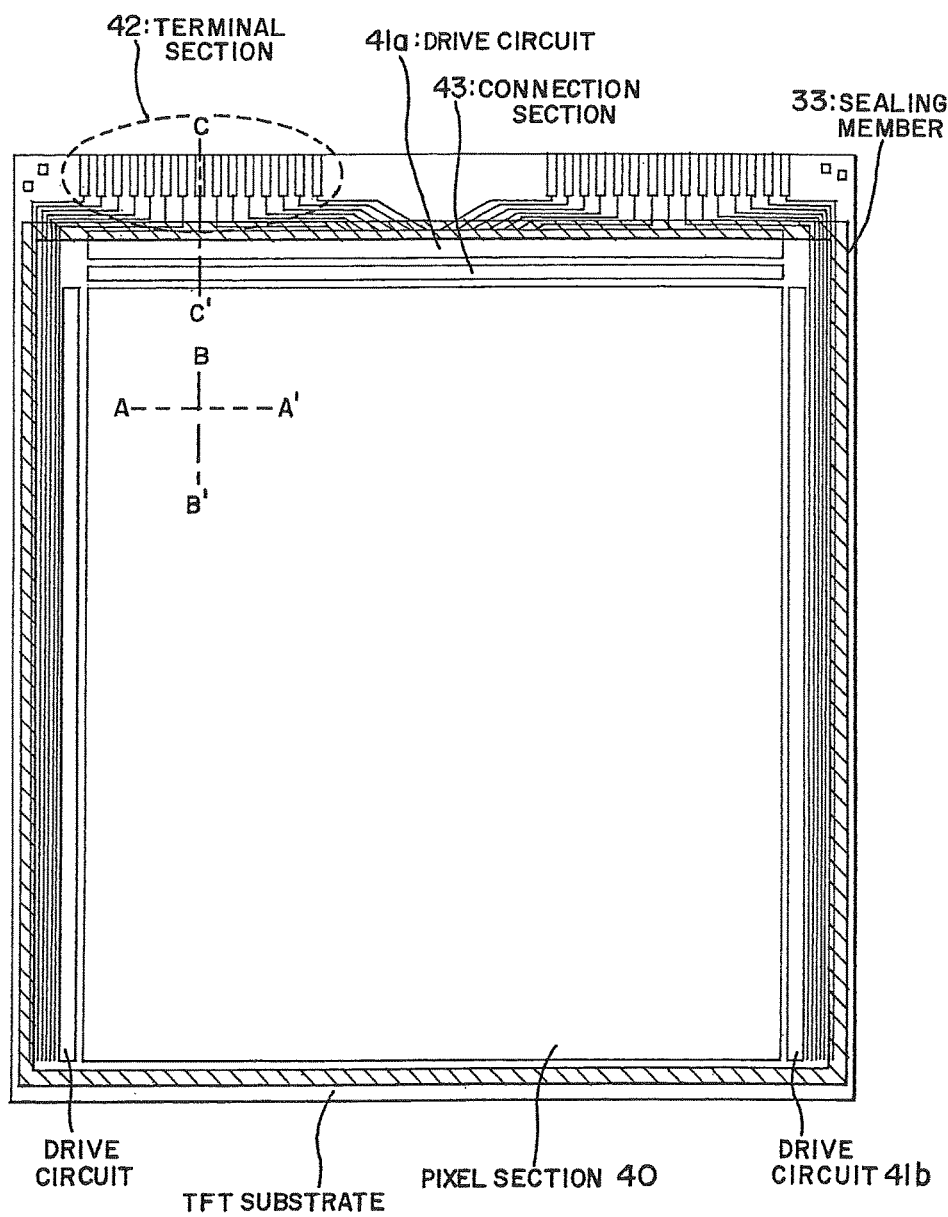

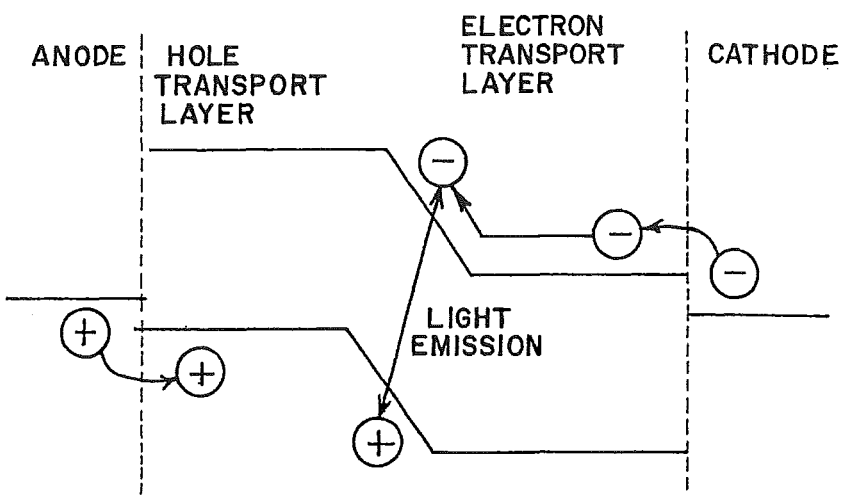
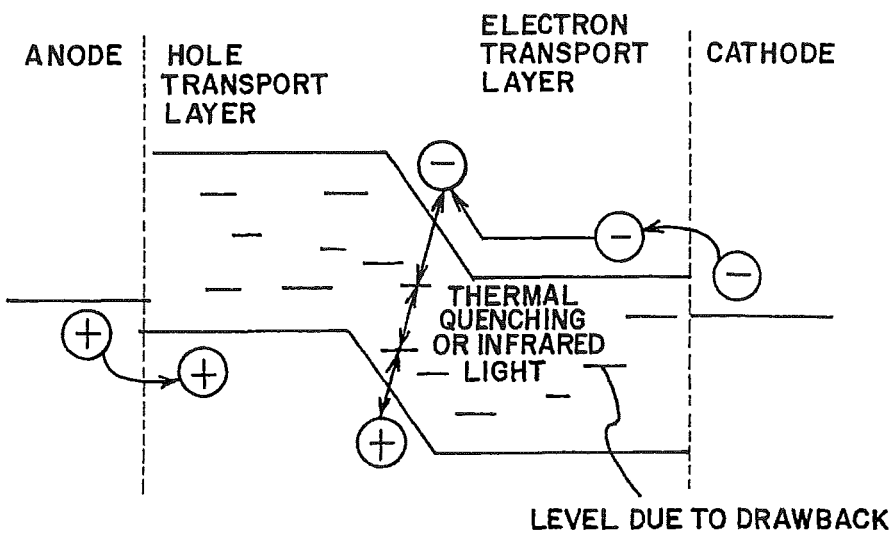

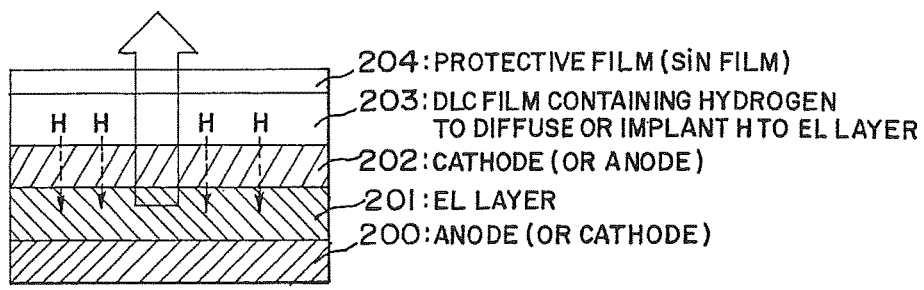
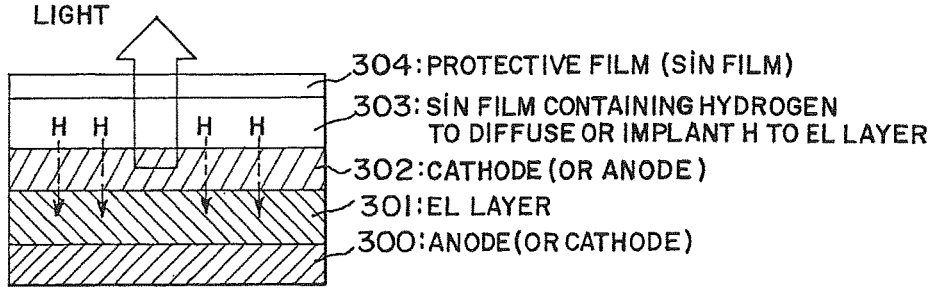
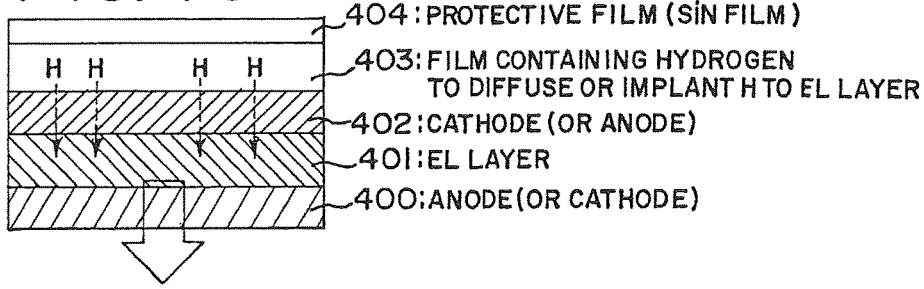

A-A' SECTIONAL VIEW

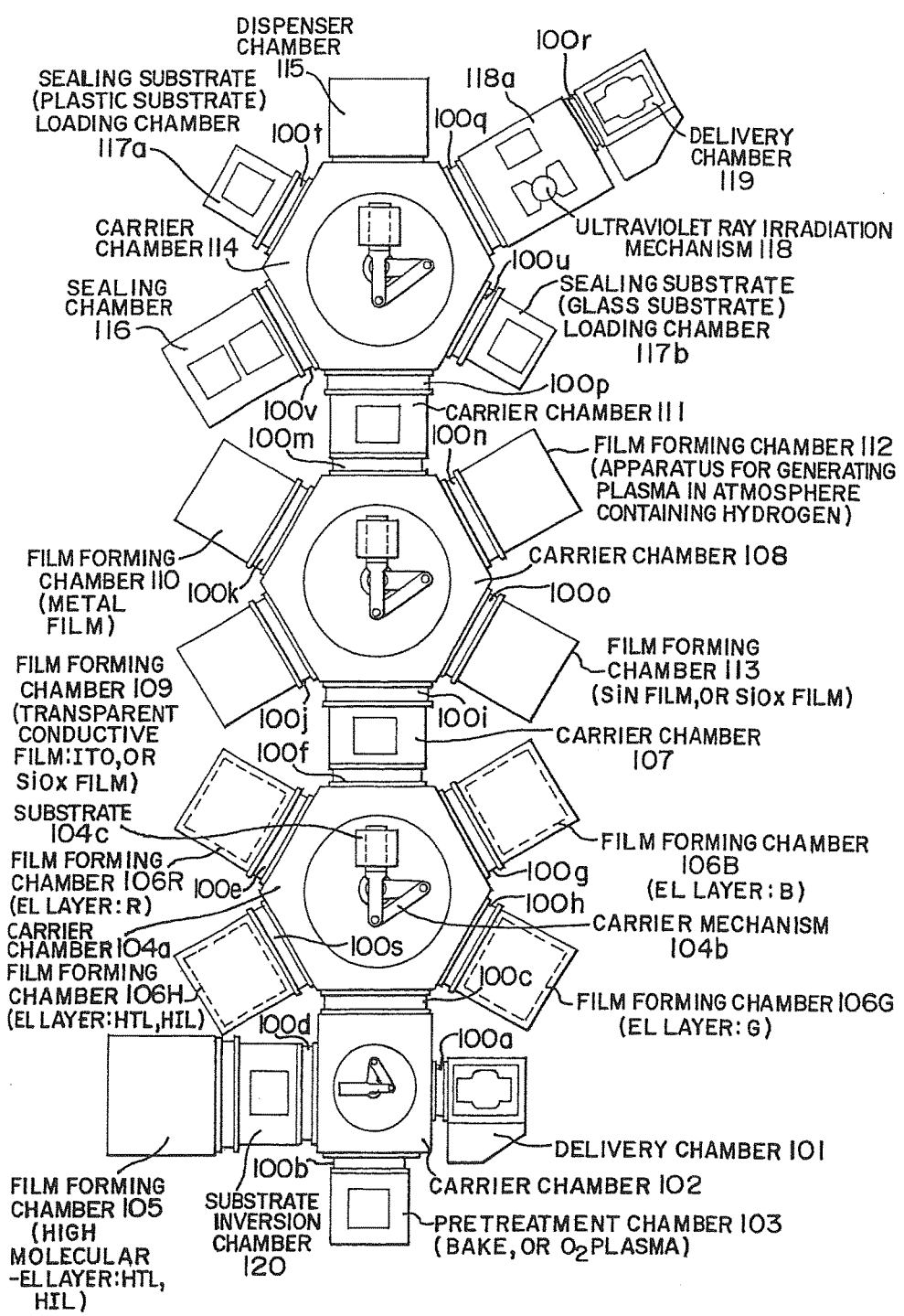

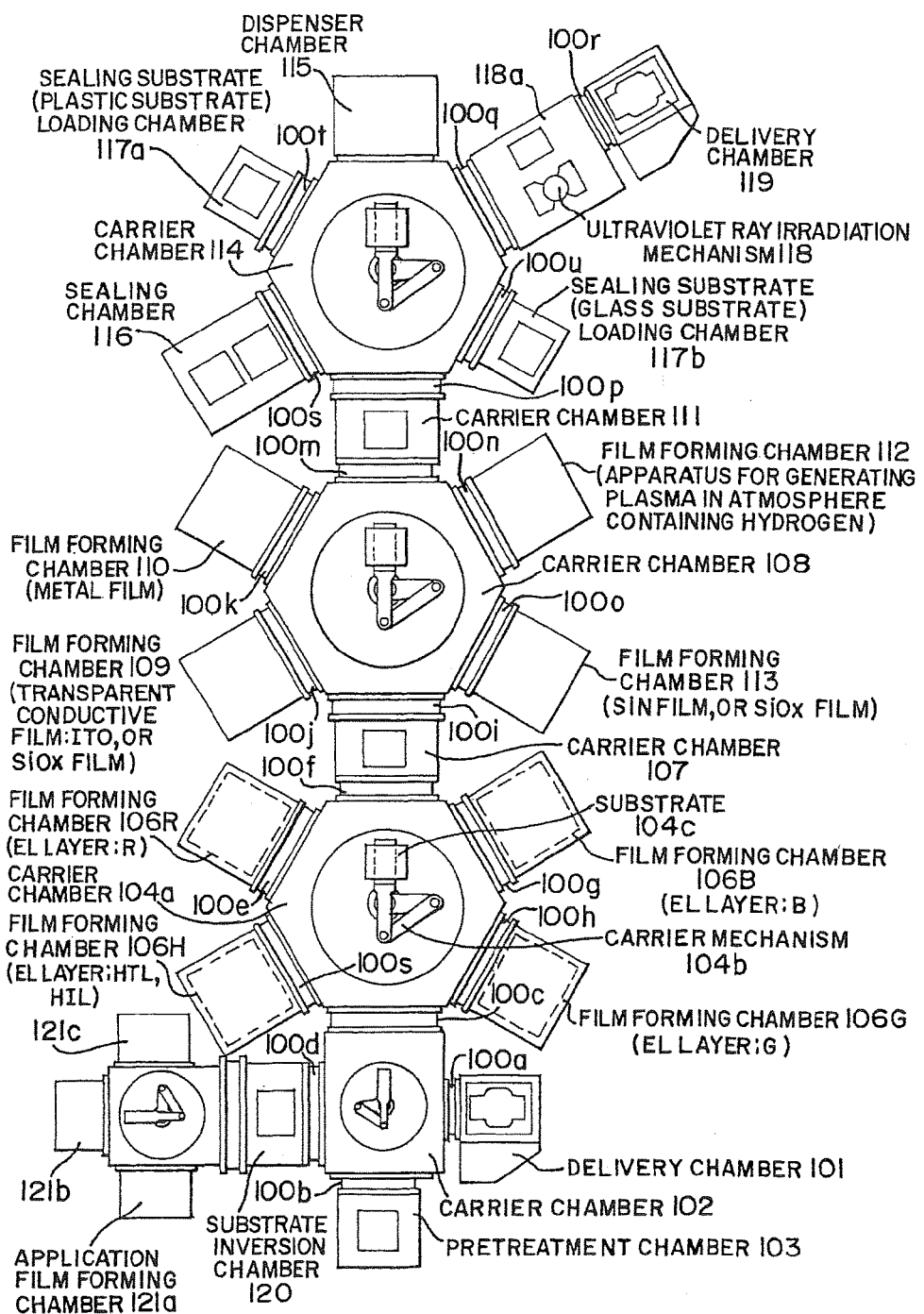

A-A' CROSS-SECTIONAL VIEW

B-B' CROSS-SECTIONAL VIEW

C-C' CROSS-SECTIONAL VIEW

A-A' CROSS-SECTIONAL VIEW

B-B' CROSS-SECTIONAL VIEW

C-C' CROSS-SECTIONAL VIEW

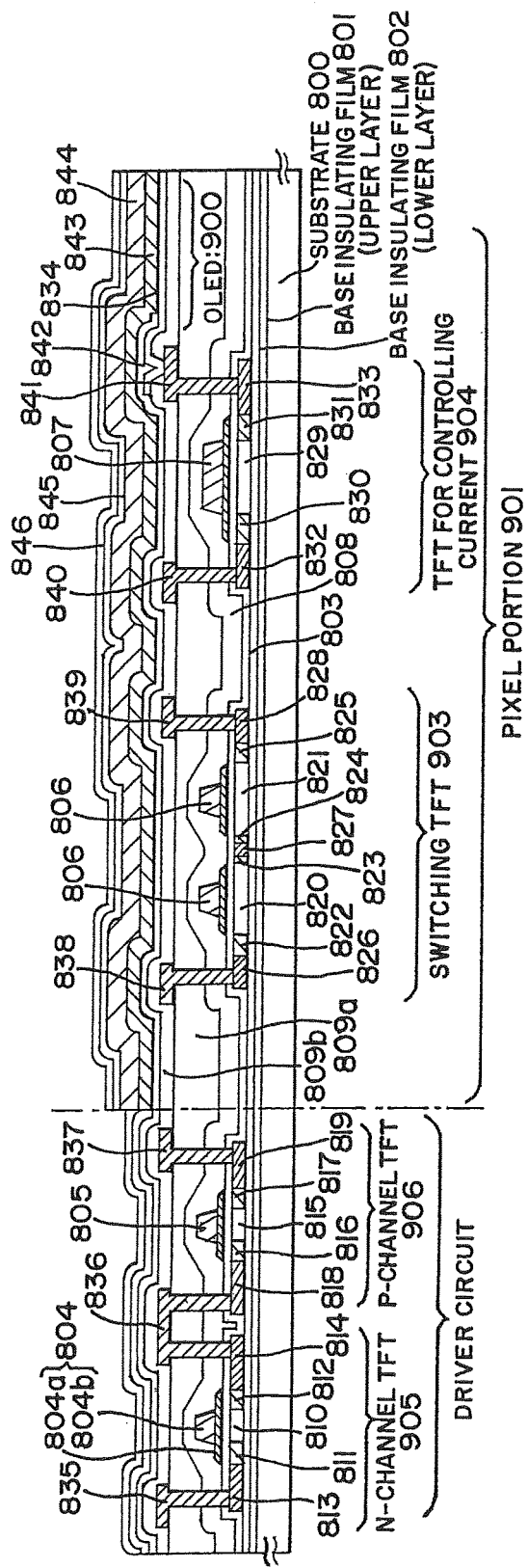

LIGHT EMITTING DEVICE, METHOD OF PREPARING THE SAME AND DEVICE FOR FABRICATING THE SAME

This application is a continuation of copending U.S. application Ser. No. 14/153,362, filed on Jan. 13, 2014 which is a continuation of U.S. application Ser. No. 11/476,508, filed on Jun. 28, 2006 (now U.S. Pat. No. 8,629,439 issued Jan. 14, 2014) which is a divisional of U.S. application Ser. No. 10/349,750, filed on Jan. 22, 2003 (now U.S. Pat. No. 7,098,069 issued Aug. 29, 2006), which are all incorporated herein by reference.

BACKGROUND OF THE INVENTION

1. Field of the Invention

The present invention relates to a semiconductor device, in particular, the present invention relates to alight emitting device having a light emitting element formed on a substrate having an insulating surface and method of manufacturing thereof. Further, the present invention relates to an organic light emitting module on which ICs and the like, including a controller, are mounted to an organic light emitting panel. Note that the terms organic light emitting panel and organic light emitting module both generically refer to light emitting devices in this specification. The present invention additionally relates to an apparatus for manufacturing the light emitting device.

In this specification, semiconductor devices correspond to general devices functioning by use of semiconductor characteristics. Therefore, a light emitting device, an electro-optical device, a semiconductor circuit and an electronic device are all included in the category of the semiconductor device.

2. Description of the Related Art

In recent years, techniques of forming TFTs (thin film transistors) on substrates have been progressing greatly, and developments in their application to active matrix type display devices is advancing. In particular, TFTs that use polysilicon films have a higher electric field effect mobility (also referred to as a mobility) than TFTs that use conventional amorphous silicon films, and therefore high speed operation is possible. Developments in performing control of pixels by forming driver circuits made from TFTs that use polysilicon films on a substrate on which the pixels are formed have therefore been flourishing. It has been expected that various advantages can be obtained by using active matrix type display devices, in which pixels and driver circuits are mounted on the same substrate, such as reductions in manufacturing cost, miniaturization of the display device, increases in yield, and reductions in throughput.

Furthermore, research on active matrix type light emitting devices using organic light emitting elements as self light emitting elements (hereinafter referred to simply as light emitting devices) has become more active.

Switching elements composed of TFTs (hereinafter referred to as switching elements) are formed for each pixel in active matrix type light emitting devices, and driver elements for performing electric current control by the switching TFTs (hereinafter referred to as electric current control TFTs) are operated, thus making EL layers (specifically, light emitting layers) emit light. For example, a light emitting device disclosed in Japan Patent Laid-Open No. 10-189252 A is known.

Organic light emitting elements are self light emitting, and therefore have high visibility. Backlights, necessary for liquid crystal display devices (LCDs), are not required for organic light emitting elements, which are optimal for making display devices thinner and have no limitations in viewing angle. Light emitting devices using the organic light emitting elements are consequently being focused upon as substitutes for CRTs and LCDs.

Note that EL elements have a layer containing an organic compound in which luminescence develops by the addition of an electric field (electroluminescence) (hereinafter referred to as EL layer), an anode, and a cathode. There is light emission when returning to a base state from a singlet excitation state (fluorescence)), and light emission when returning to a base state from a triplet excitation state (phosphorescence) in the organic compound layer, and it is possible to apply both types of light emission to light emitting devices manufactured by the manufacturing apparatus and film formation method of the present invention.

The EL elements have a structure in which an EL layer is sandwiched between a pair of electrodes, and the EL layer normally has a laminate structure.

A laminate structure of "a hole transporting layer/a light emitting layer/electron transporting layer" can be given as a typical example. This structure has extremely high light emitting efficiency, and at present almost all light emitting devices undergoing research and development employ this structure.

Further, a structure in which: a hole injecting layer, a hole transporting layer, a light emitting layer, and an electron transporting layer are laminated in order on an anode; or a hole injecting layer, a hole transporting layer, alight emitting layer, an electron transporting layer, and an electron injecting layer are laminated in order on an anode may also be used. Fluorescent pigments and the like may also be doped into the light emitting layers. Further, all of the layers may be formed by using low molecular weight materials, and all of the layers may be formed by using high molecular weight materials.

SUMMARY OF THE INVENTION

Concerning an organic compound material constituting an EL layer (strictly speaking, that is, light emitting layer) which can be referred to as a center of an EL element, a short chain based organic compound material and a polymer molecule based (polymer based) organic compound material have been investigated, respectively.

As a method of forming these organic compound materials into a film, an ink jet method, a vapor deposition method, a spin coating method and the like are known.

However, in the case where a flat panel display of full colors using the emitting colors of red, green and blue is to be prepared, since the deposition precision is not so high, it is designed so that the interval between different pixels is widened, or an insulator which is called as a "bank" is provided between the pixels.

Moreover, as a flat panel display of full colors using red, green and blue, the requirements for a high definition, a high aperture efficiency and a high reliability has been heightened. Such requirements have been big problems in seeking for the high definition (increase of the number of pixels) of a light emitting device and miniaturization of the respective display pixel pitch accompanied with downsizing of the device. Moreover, at the same time, the requirements for the enhancement of the productivity and the lowering of the cost have been also heightened.

In addition, the present invention is also directed to enhance the reliability and brightness of a light emitting element.

The present invention realizes the high definition and high aperture efficiency of a product for a flat panel display of full colors using luminescent colors of red, green and blue without being dependent upon a method of forming an organic compound layer and the deposition precision by intentionally overlapping one portion of different organic compound layers of the adjacent light emitting elements.

However, an inorganic insulating film is provided between the portion where one portion of different organic compound layers are overlapped and a pixel electrode, this inorganic insulating film covers both ends of the respective pixel electrodes and intervals between them. It should be noted that even in the case where the other organic compound layer has superimposed onto the organic compound layer being in contact with the pixel electrode, since the emission brightness is lowered to about 1/1000 and the flowing current also becomes about 1/1000, no problem occurs. In the configuration 1 of the present invention disclosed in the present specification, a light emitting device is characterized in that, the foregoing light emitting device has a plurality of light emitting elements having a cathode, an organic compound layer being in contact with the relevant cathode and an anode being contact with the relevant organic compound layer, in which, a first light emitting element having a first organic compound layer, a second light emitting element having a second organic compound layer, and a third light emitting element having a third organic compound layer have been arranged, and which, has an insulator for covering the ends of the foregoing anode, and in which the foregoing first organic compound layer, the foregoing second organic compound layer or the foregoing third organic compound layer has been provided on the relevant insulator and the foregoing anode.

In the configuration 2 of the present invention disclosed in the present specification, a light emitting device is characterized in that, the foregoing emitting device has a plurality of light emitting elements having a cathode, an organic compound layer being in contact with the relevant cathode and an anode being in contact with the relevant organic compound layer, in which, a first light emitting element having a first organic compound layer, a second light emitting element having a second organic compound layer, and a third light emitting element having a third organic compound layer have been arranged, and which, has an insulator for covering the ends of the foregoing cathode, and in which the foregoing first organic compound layer, the foregoing second organic compound layer or the foregoing third organic compound layer has been provided on the relevant insulator and the foregoing cathode.

Moreover, concerning an active matrix type light emitting device, two types of structures are contemplated from the viewpoint of radiation direction of the light. One is a structure in which the light emitted from an EL element transmits through the opposing substrate and irradiated to the observer's eyes. In this case, the observer can recognize an image from the opposing substrate side. The other is a structure in which the light emitted from an EL element transmits through the element substrate and irradiated to the observer's eyes. In this case, the observer can recognize an image from the element substrate side.

Moreover, in the above-described respective configurations, the foregoing insulator is characterized in that it is a barrier (also referred to as bank) composed of an organic resin covered by an inorganic insulating film or an inorganic insulating film. It should be noted that the foregoing inorganic insulating film is characterized in that it is an insulating film whose film thickness is in the range from 10 to 100 nm and whose major component is silicon nitride. Moreover, as an insulator for covering ends of a cathode or an anode, a film containing hydrogen, representatively, a thin film whose major component is carbon or a silicon nitride film may be used.

In addition, it is extremely useful that as an anode, a transparent conductive film (representatively, ITO, ZnO) is used, and further, on which, a protective film composed of an inorganic insulating film is formed.

Furthermore, it is preferable that prior to the formation of the protective film composed of an inorganic insulating film, a film containing hydrogen (representatively, thin (DLC film) whose major component is carbon, silicon nitride film, silicon oxynitride film, silicon oxide film or laminated film thereof) is formed by a plasma CVD method or a sputtering method. Moreover, it is preferable that a silicon nitride film as a protective film is formed by covering the foregoing film containing hydrogen. Moreover, in the above-described respective configurations, the foregoing first light emitting element is characterized in that it emits any one of color out of red color, green color or blue color. Moreover, the foregoing first light emitting element, the foregoing second light emitting element and the foregoing third light emitting element are characterized in that these emit colors different from each other.

Moreover, in the above-described respective configurations, it is preferable that in a sealing, the whole of a light emitting element is sealed using a sealing substrate, for example, a glass substrate or a plastic substrate.

Moreover, in a light emitting device, there has been a problem such that an incident light from the exterior (light from the exterior of the light emitting device) is reflected by the backside of a cathode (surface of the side being in contact with the light emitting layer) in a pixel not emitting the light, the backside of the cathode acts as a mirror, and the exterior landscape is projected on the observation surface (surface facing to the observer side). Moreover, in order to avoid this problem, it has been devised such that a circularly polarized light film was pasted on the observation surface of the light emitting device, but there has been a problem that since the cost of the circularly polarized light film is very high, it causes the increase of the manufacturing cost.

An object of the present invention is to prevent a light emitting device from being mirror plate without using a circularly polarized film, by means of this, the present invention is directed to reduce the manufacturing cost of a light emitting device, and also to provide a cheap light emitting device. Hence, in the present invention, it is characterized in that instead of a circularly polarized film, a cheap color filter is used. In the above-described configuration, in order to enhance the color purity, it is preferable that the foregoing light emitting device is equipped with a color filter corresponding to the respective pixel. Moreover, it may be made so that the portion of the black color of the color filter (black color organic resin) is overlapped with the interval between the respective light emitting regions. Furthermore, it may be also configured so that the portion of the black color of the color filter is partially overlapped with the different organic compound layer.

However, in the outgoing direction of emission, specifically, between the foregoing light emitting element and the observer, a color filter is provided. For example, in the case where it is not transmitted through the substrate on which the light emitting element is provided, a color filter may be pasted on the sealing substrate. Or, in the case where it is transmitted through the substrate on which the light emitting element is provided, the color filter may be pasted on the substrate on which the light emitting element is provided. By thus doing it, the circularly polarized film becomes unnecessary.

Moreover, the biggest problem among the practical applications of an EL element is the fact that the lifespan of an element is insufficient. Moreover, the deterioration of an element appears in a form where non-light emitting region (dark spot) is widened accompanying with emitting the light for long time, and the deterioration of an EL layer becomes a big problem as a causing factor of it.

In order to solve the problem, the present invention is characterized in that plasma is generated under the atmosphere containing hydrogen and the drawbacks in the organic compound layer are terminated with hydrogen. The other configuration 3 of the present invention is characterized in that it has, a light emitting element on the substrate having an insulation surface, the relevant light emitting element has an anode, a cathode and an organic compound layer sandwiched between the foregoing anode and the foregoing cathode, and the foregoing light emitting element is covered with a film containing hydrogen.

The drawback in an organic compound layer can be terminated with hydrogen by diffusing hydrogen from the above-described film containing hydrogen by means of performing the heating treatment in a temperature range where the organic compound layer is durable or by means of utilizing the heat generation generated at the time when the light emitting element emits the light. Once the drawback in the organic compound layer, representatively, a dangling bond is terminated with hydrogen, the reliability for a light emitting device is enhanced. Moreover, when the above-described film containing hydrogen is formed in a film, the drawback in the organic compound layer may be terminated with hydrogen by diffusing or implanting hydrogen which has been made plasmatic. By thus performing, unstable bonds existed in the organic compound layer or generated by any of the causing factors (heat generation generated at the time when it emits, irradiation of light, change of temperatures, and the like) can be reduced. Therefore, the enhancement of the reliability and brightness as a light emitting element can be realized. Moreover, the protective layer for covering and forming the film containing hydrogen blocks hydrogen diffusing to the protective layer side and efficiently diffusing hydrogen into an organic compound layer and plays a role for terminating the drawback in the organic compound layer with hydrogen. Moreover, in order to make hydrogen transmit through a cathode or an anode formed on the organic compound layer and diffuse hydrogen, it is preferable that the thickness of the cathode or anode is made thinner. However, the cathode or anode formed on the organic compound layer is protected not to damage the organic compound layer at the time when the film containing hydrogen is formed. Moreover, the above-described film containing hydrogen can be functioned as a protective film of a light emitting element. Furthermore, the above-described film containing hydrogen can be functioned as a buffer layer, in the case where a silicon nitride film is formed in a state where it is in contact with a film composed of a transparent conductive film by a sputtering method, it is feared that impurities (In, Sn, Zn and the like) contained in the transparent conductive film is contaminated into the silicon nitride film. However, the impurities contamination into the silicon nitride film can be prevented by forming the above-described film containing hydrogen which is to be a buffer layer between two films. The contamination of the impurities (In, Sn and the like) from the transparent conductive film is prevented and an excellent protective film without any impurities can be formed.

Moreover, a preparation method for realizing the above-described configurations is also one of the present invention, the constitution relating to the preparation method of the present invention is, a method of preparing a light emitting device characterized in that a TFT is formed on an insulation surface, a cathode electrically connected to the foregoing TFT is formed, an organic compound layer is formed on the foregoing cathode, after an anode has been formed on the foregoing organic compound layer, and a film containing hydrogen is formed on the foregoing anode.

Moreover, the other constitution relating to a preparation method of the present invention is, a method of preparing a light emitting device characterized in that a TFT is formed on an insulation surface, an anode electrically connected to the foregoing TFT is formed, an organic compound layer is formed on the foregoing anode, and after a cathode has been formed on the foregoing organic compound layer, a film containing hydrogen is formed on the foregoing cathode.

Moreover, in the above-described respective constitutions relating to a preparation method of the present invention, the foregoing film containing hydrogen is characterized in that it is formed in the temperature range where the foregoing organic compound layer is durable, for example, in the range from room temperature to 100° C. or less by a plasma CVD method or a sputtering method, and the foregoing film containing hydrogen is characterized in that it is a thin film whose major component is carbon or it is a silicon nitride film.

Moreover, in the above-described respective constitutions relating to a preparation method of the present invention, a step of forming the foregoing organic compound layer is characterized in that it is carried out by a vapor deposition method, a coating method, an ion plating method or an ink jet method.

Moreover, in the above-described constitutions relating to a preparation method of the present invention, the present invention is characterized in that a protective film composed of an inorganic insulating film is formed on the foregoing film containing hydrogen.

Moreover, in the above-described constitutions relating to a preparation method of the present invention, the present invention is characterized in that at the time when the foregoing film containing hydrogen is formed, the drawback in the foregoing organic compound layer is terminated with hydrogen.

Moreover, in order to prevent the deterioration by moisture or oxygen, at the time when a light emitting element is sealed with a sealing can or a sealing substrate, hydrogen gas may be filled in the space to be sealed or hydrogen and inert gas (rare gas or nitrogen) may be filled.

Moreover, it has been made that in the above-described preparation method at the time when the film is formed, the drawbacks in the foregoing organic compound layer are terminated with hydrogen, but it is not particularly limited to that. Even if the film is not formed, only hydrogen plasma treatment may be performed. The other constitution relating to a preparation method of the present invention is characterized in that it comprises, in a method of preparing a light emitting device having a plurality of light emitting elements having an anode, an organic compound layer which is in contact with the relevant anode and superimposed on the anode, a cathode which is in contact with the organic compound layer and superimposed on the organic compound layer, a first step of forming an organic compound layer on the anode, a second step of performing the treatment for terminating the drawback with hydrogen in the foregoing organic compound layer by generating a plasma under the atmosphere containing hydrogen after the formation of the foregoing organic compound layer, and a third step of forming a cathode on the foregoing organic compound layer.

Moreover, hydrogen plasma treatment may be performed immediately after the organic compound layer has been formed, other constitution relating to a preparation method of the present invention is characterized in that it comprises, in a method of preparing a light emitting device having a plurality of light emitting elements having an anode, an organic compound layer which is in contact with the relevant anode and superimposed on the anode, a cathode which is in contact with the organic compound layer and superimposed on the organic compound layer, a first step of forming an organic compound on the anode, a second step of forming a cathode on the foregoing organic compound layer, and a third step of performing the treatment for terminating the drawbacks in the foregoing organic compound layer with hydrogen by generating a plasma under the atmosphere containing hydrogen after the formation of the foregoing cathode.

Moreover, other constitution relating to a preparation method of the present invention is characterized in that it comprises, in a method of preparing a light emitting device having a plurality of light emitting elements having a cathode, an organic compound layer which is in contact with the relevant cathode and superimposed on the cathode, an anode which is in contact with the relevant organic compound layer and superimposed on the organic compound layer, a first step of forming an organic compound layer on the cathode, a second step of forming an anode on the foregoing organic compound layer, and a third step of performing the treatment for terminating the drawbacks in the foregoing organic compound layer with hydrogen by generating a plasma under the atmosphere containing hydrogen after the formation of the foregoing anode.

Moreover, hydrogen plasma treatment may be performed immediately after the organic compound layer has been formed, other constitution relating to a preparation method of the present invention is characterized in that it comprises, in a method of preparing a light emitting device having a plurality of light emitting elements having a cathode, an organic compound layer which is in contact with the relevant cathode and superimposed on the cathode, an anode which is in contact with the relevant organic compound layer and superimposed on the organic compound layer, a first step of forming an organic compound on the cathode, a second step of performing the treatment for terminating the drawbacks in the foregoing organic compound layer with hydrogen by generating a plasma under the atmosphere containing hydrogen after the formation of the foregoing organic compound layer, and a third step of forming an anode on the foregoing organic compound layer.

It should be noted that in the present specification, all of the layers provided between a cathode and an anode is generally referred to as an EL layer. Therefore, the above-described hole injection layer, hole transport layer, light emitting layer, electron transport layer and electron injection layer are all contained in the EL layer.

In the present invention, a thin film whose major component described above is carbon is characterized in that it is a DLC (Diamond Like Carbon) film of 3-50 nm in the film thickness. The DLC film has a $SP^3$ bonding as a carbon-carbon bonding in a short range order, but in macro range order, it has an amorphous structure. The composition of the DLC film is composed of 70-95 atom % of carbon and 5-30 atom % of hydrogen, is very hard and excellent in insulation. The DLC film thus formed is characterized in that gas transmittance such as water vapor, oxygen and the like is low. Moreover, it is known that it has a hardness of 15-25 GPa by the measurement of micro-hardness meter.

The DLC film can be formed by plasma CVD method (representatively, RF plasma CVD method, microwave CVD method, electron cyclotron resonance (ECR) CVD method and the like), a sputtering method and the like. The DLC film can be formed with excellent adhesion by any film formation method. The DLC film is formed by setting a cathode on the substrate. Or, a film being dense and hard can be formed by applying a negative bias and by utilizing an ion bombardment to some extent.

As for a reactant gas used for forming a film, hydrogen gas and hydrocarbon based gas (for example, $CH_4$, $C_2H_2$, $C_6H_6$ and the like) are used, ionized by glow discharge, an ion is accelerated and bombarded against the cathode which has been negatively self-biased, thereby forming a film. By thus performing, a DLC film being dense and smooth can be obtained.

Moreover, this DLC film is characterized in that it is an insulation film transparent or semi-transparent with respect to the visible light.

Moreover, in the present specification, "being transparent with respect to the visible light" means that the transmittance of the visible light is in the range from 80 to 100%, and "being semi-transparent with respect to the visible light" means that the transmittance of the visible light is in the range from 50 to 80%.

Moreover, the present invention provides a fabrication unit capable of fabricating a light emitting device having a high reliability.

Other constitution of the present invention is a constitution relating to a fabrication unit, characterized in that the fabrication unit comprises, loading chamber, a first carrier chamber connected to the relevant chamber and the foregoing treatment chamber connected to the relevant first carrier chamber, a second carrier chamber connected to the foregoing first carrier chamber, and a film forming chamber of a plurality of organic compound layers connected to the relevant second carrier chamber, a third carrier chamber connected to the foregoing second carrier chamber, and a film forming chamber of a metal layer, a film forming chamber of a transparent conductive film connected to the relevant third carrier chamber, a treatment chamber equipped with means for generating a plasma under the atmosphere containing hydrogen, and a film forming chamber of a protective film, and a fourth carrier chamber connected to the foregoing third carrier chamber, and a dispenser chamber, a sealing substrate loading chamber, and a sealing chamber connected to the relevant fourth carrier chamber.

The constitution relating to the above-described fabrication unit is characterized in that the foregoing pretreatment chamber has vacuum exhaust means, heating means, and plasma generation means. Moreover, in the above-described fabrication unit, the fabrication unit is characterized in that a device for forming an organic compound layer composed of a polymer molecular material is connected to the foregoing first carrier chamber, and the device for forming an organic compound layer composed of the foregoing polymer molecular material is a device in which the film formation is performed by a spin coat method, a spray method, an ion plating method, or an ink jet method.

Moreover, in the constitution relating to the above-described device, a treatment chamber equipped with means for generating a plasma under the atmosphere containing hydrogen is characterized in that it is a film formation unit of a silicon nitride film or a film whose major component is carbon.

Moreover, in the constitution relating to the above-described fabrication unit, a film forming chamber of a plurality of organic compound layers connected to the foregoing second carrier chamber is characterized in that it has a vapor deposition source.

Using a fabrication unit indicating the above-described constitution, a light emitting device in which an EL element is covered with a film containing hydrogen and a protective film can be prepared with good throughput.

BRIEF DESCRIPTION OF THE DRAWINGS

FIG. 2 is a diagram showing the top view (Embodiment 1);

FIGS. 3A and 3B are diagrams showing a model diagram (Embodiment 2);

FIGS. 4A to 4C are diagrams showing a laminated structure of the present invention (Embodiment 2);

FIG. 6 is a diagram showing one example of a fabrication unit (Embodiment 4);

FIG. 7 is a diagram showing one example of a fabrication unit (Embodiment 4);

FIG. 12 is a diagram showing a sectional view of an active matrix substrate (Example 1);

DESCRIPTION OF THE PREFERRED EMBODIMENTS

Figure 1A:
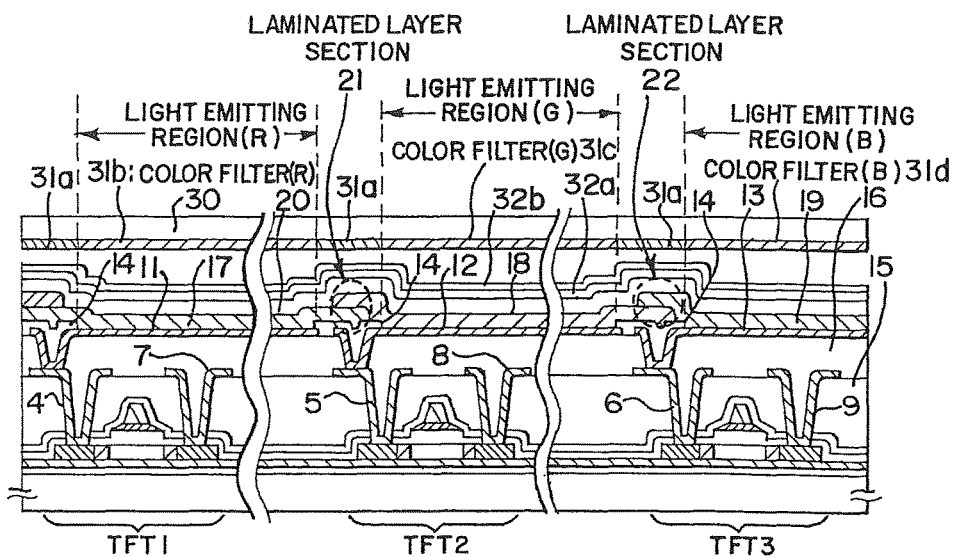
FIGS. 1A to 1C are diagrams showing sectional views (Embodiment 1)

Hereinafter, embodiment of the present invention will be described.

Embodiment 1

FIG. 2 is a top view of an EL module. On a substrate (referred to as TFT substrate) on which many TFTs are provided, a pixel section 40 where the display is performed, drive circuits 41a, 41b for driving the respective pixels of the pixel section, a connection section 43 connecting an electrode provided on the EL layer and the drawing wiring, and a terminal section 42 for pasting FPC for connecting with the exterior circuit are provided. Moreover, the EL element is sealed with a substrate for sealing the EL element and a sealing member 33. Moreover, FIG. 1A is a sectional view taken on chain line A-A' of FIG. 2.

The pixels are disposed in order in the direction of the chain line A-A', now, an example in which R, G and B in turn are disposed in the X direction is exemplified. In the present invention, as shown in FIG. 1A, a laminated layer section 21 in which an EL layer 17 for emitting red color and an EL layer 18 for emitting green color are partially overlapped with each other is formed. Moreover, a laminated section 22, in which the EL layer 18 for emitting green color and the EL layer 19 for emitting blue color are partially overlapped with each other, is formed.

In this way, since the present invention makes the configuration in which the EL layer may be partially overlapped, a high definition and high aperture efficiency can be realized as a flat panel display of full colors using emitting colors of red, green and blue without depending upon a method of forming an organic compound layer (ink jet method, vapor deposition method, spin coating method and the like) and the deposition precision.

Moreover, in FIG. 1A, the light emitting region (R) indicates a light emitting region of red, the light emitting region (G) indicates a light emitting region of green, the light emitting region B indicates a light emitting region of blue, and a light emitting display device which has been fully colored is realized by these light emitting regions of three colors.

Moreover, in FIG. 1A, a TFT 1 is an element for controlling the current flowing in the EL layer 17 which emits red color, the reference numerals 4, 7 denote a source electrode or a drain electrode. Moreover, a TFT 2 is an element for controlling the current flowing in the EL layer 18 which emits green color, the reference numerals 5,8 denote a source electrode or a drain electrode. A TFT 3 is an element for controlling the current flowing in the EL layer which emits blue color, the reference numerals 6, 9 denote a source electrode or a drain electrode. The reference numerals 15, 16 denote interlayer insulation films composed of an organic insulating material or an inorganic insulating film material.

Moreover, the reference numerals 11-13 denote an anode (or a cathode) of an organic light emitting element, the reference numeral 20 denotes a cathode (or anode) of an organic light emitting element. Here, for the cathode 20, it is made an electrode composed of a laminated layer film of a metal layer whose film thickness is 10 nm or less (representatively, alloy such as MgAg, MgIn, AlLi and the like) and a transparent conductive film (ITO (indium tin oxide alloy), indium oxide-zinc oxide alloy ($In_2O_3$—ZnO), zinc oxide (ZnO) and the like), and the lights from the respective light emitting elements are transmitted through it. It should be noted that although a thin metal layer functions as a cathode of a light emitting element, in the present specification, a laminated layer film of a thin metal layer and a transparent conductive film is referred to as a cathode.

Moreover, both ends of the reference numerals 11-13 and the portion between them are covered with an inorganic insulator 14. Moreover, an organic compound layer is formed even on one portion on the inorganic insulator 14. The film thickness of the inorganic insulator 14 is 1 μm or less, the film formed on the inorganic insulator 14 can be thinned as well as the coverage of the film formed on the inorganic insulator 14 can be made better.

Figure 1B:
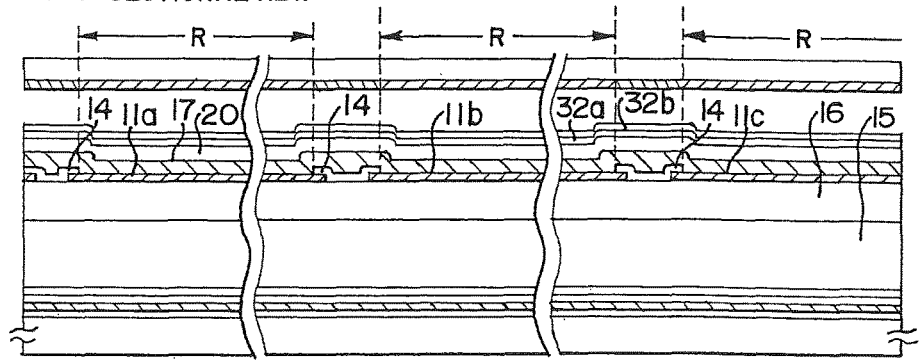
Figure 1C:
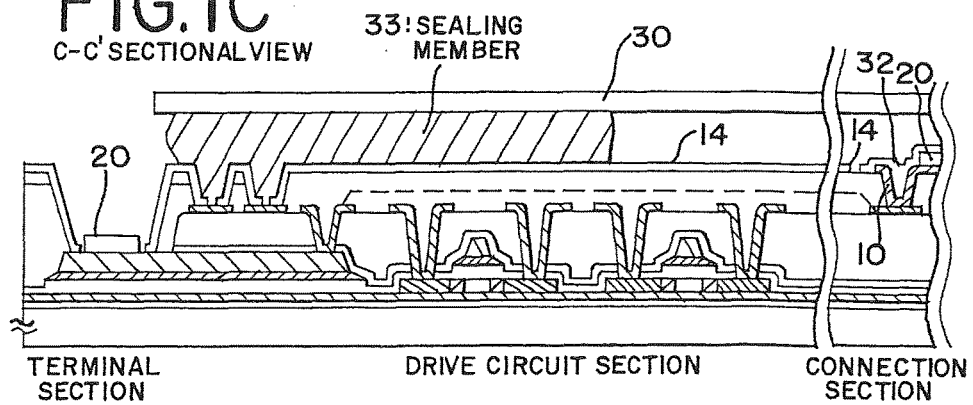

It should be noted that FIG. 1C is a sectional view taken on the chain line C-C' shown in FIG. 2. Moreover, In FIG. 1C, it is shown that the electrodes indicated with dotted line are electrically connected to each other. Moreover, in the terminal section, the electrode of terminal is formed with the same material with that of the cathode 20.

Moreover, a sealing substrate 30 is pasted with a sealing member 33 so as to maintain the interval of about 10 μm, and all of the light emitting element is sealed. It should be noted that the sealing member 33 is preferably framed narrowly so that it overlaps one portion of a drive circuit. It is preferable that immediately before the sealing substrate 30 is pasted with the sealing member 33, the degassing is carried out by performing the annealing in vacuum. Moreover, it is preferable that at the time when the sealing substrate 30 is pasted, it is performed under the atmosphere containing hydrogen and an inert gas (rare gas or nitrogen), hydrogen is made contained in the space sealed with the protective film 32, the sealing member 33 and the sealing substrate 30. The drawback in the organic compound layer can be terminated with hydrogen by utilizing the heat generation generated at the time when the light emitting element emits the light and by diffusing hydrogen from the space containing the above-described hydrogen. Terminating the drawback in the organic compound layer with hydrogen, the reliability for a light emitting device is enhanced. Furthermore, in order to enhance the color purity, the color filters corresponding to the respective pixels are provided in the sealing substrate 30. Out of the color filters, the red colored layer 31b is provided opposing to the red color light emitting region (R), the green colored layer 31c is provided opposing to the green color light emitting region (G) and the blue colored layer 31d is provided opposing to the blue color light emitting region (B). Moreover, the region except for the light emitting region is shielded with the black portion of the color filter, that is, shielded with a shielding section 31a. It should be noted that the light shielding section 31a is composed of a metal film (chromium and the like) or an organic film containing a black pigment.

In the present invention, a circularly polarized plate is not required since the color filters are provided.

Moreover, FIG. 1B is a sectional view taken on chain line B-B' shown in FIG. 2. Also in FIG. 1B, both ends of 11a-11c and their interval are covered with the inorganic insulating matter 14. Here, an example in which the EL layer 17 for emitting red color is common is shown, but it is not limited to that. The EL layer may be formed per each pixel for emitting the same color.

Moreover, in FIG. 1, the protective film 32b for enhancing the reliability of the light emitting device is formed. The protective film 32b is an insulation film whose major component is silicon nitride or silicon oxynitride, obtained by a sputtering method. Moreover, in FIG. 1, in order to make the emitted light pass through the protective film 32b, it is preferable that the film thickness of the protective film 32b is made as thinner as possible.

Furthermore, the protective film 32a containing hydrogen is formed before the protective film 32b is formed for the purpose of enhancing the reliability of a light emitting device. The drawbacks of the organic compound layers 17-19 are terminated by forming the protective film 32a containing hydrogen before the protective film 32b is formed. The foregoing film 32a containing hydrogen may be made a thin film whose major component is carbon or a silicon nitride film. As a method of forming the film 32a containing hydrogen, in the temperature range, for example, in the range from room temperature to 100° C. or less where the foregoing organic compound layer is durable, it is formed by plasma CVD method or by a sputtering method. It should be noted that in FIG. 1, the film 32a containing hydrogen is considered as a layer located beneath the protective film. Moreover, the above-described film 32a containing hydrogen can be made as a buffer layer that relaxes the film stress of the protective film 32b.

Figure 10A:
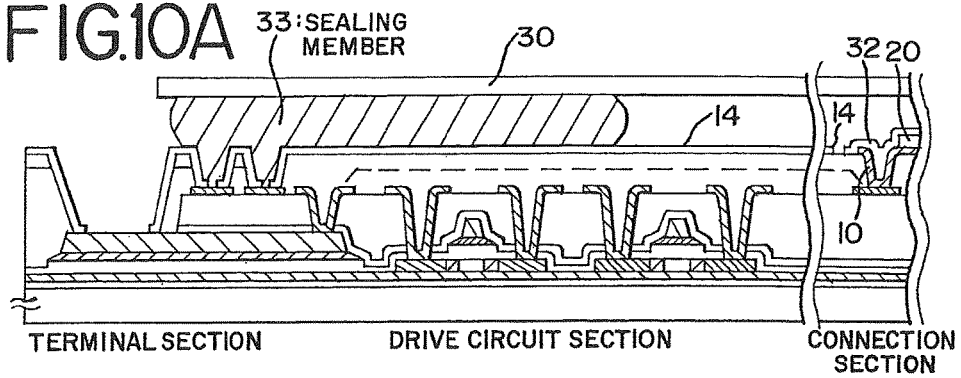
FIGS. 10A to 10D are diagrams showing sectional views (Embodiment 1)

Moreover, the present invention is, needless to say, not limited to the configuration shown in FIG. 1C. The examples in which one portion of the configuration is different from the configuration of FIG. 1C are shown in FIGS. 10A to 10D. It should be noted that for the simplification, in FIGS. 10A to 10D, the same reference numerals are used for the same portions with those in FIG. 1. FIG. 1C is an example in which an electrode composed of the same material (transparent electrode) with that of the cathode in the terminal section, while FIG. 10A is an example in which FPC is contacted with the electrode (upper layer is W film and the lower layer is TaN film) composed of the same material with that of the gate electrode of TFT.

Figure 10B:
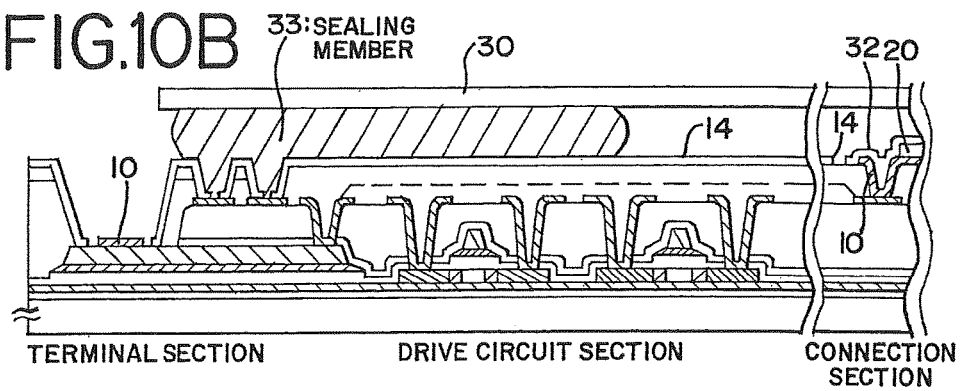
Figure 10C:
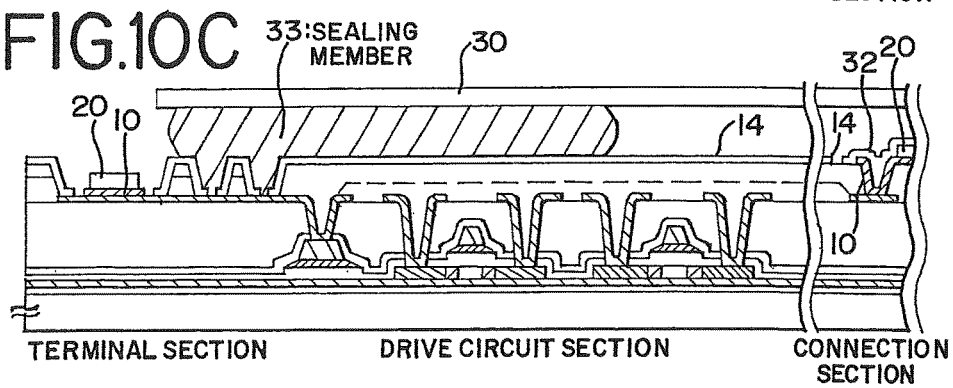

Moreover, FIG. 10B is an example in which the FPC is connected with the electrode 10 composed of the same material with that of the pixel electrode (anode). It should be noted that this electrode 10 is provided on the electrode (upper layer is W film and the lower layer is TaN film) whose material is the same with that of the gate electrode of TFT and contacted with the electrode. Moreover, FIG. 10C is an example in which the FPC is contacted with an electrode composed of the same material (transparent electrode) with the cathode 20 formed on the electrode 10 composed of the same material with the pixel electrode (anode) provided on the drawing wiring of the TFT (wiring that TiN film, Al film, TiN film in turn are laminated).

Figure 10D:
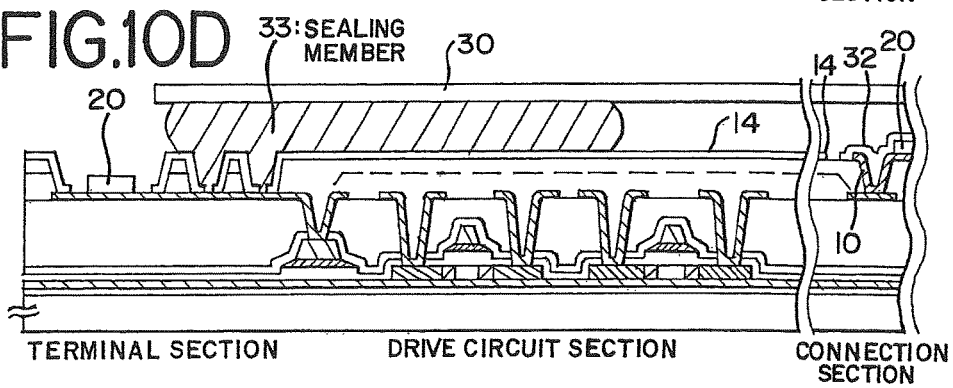

Moreover, FIG. 10D is an example in which the FPC is contacted with an electrode composed of the same material (transparent electrode) with the cathode 20 formed on the drawing wiring (wiring that TiN film, Al film, TiN film in turn are laminated).

Figure 8A:
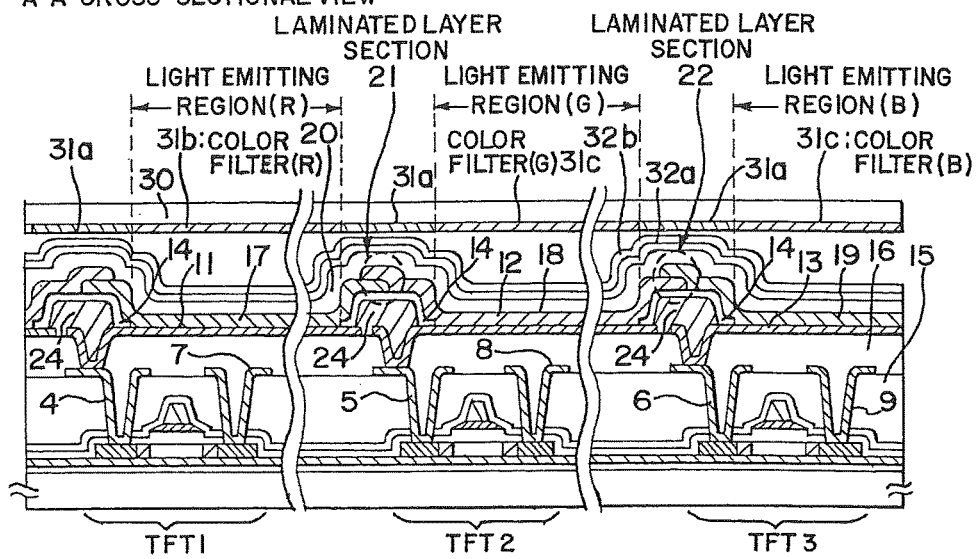
FIGS. 8A to 8C are diagrams showing sectional views (Embodiment 1)
Figure 8B:
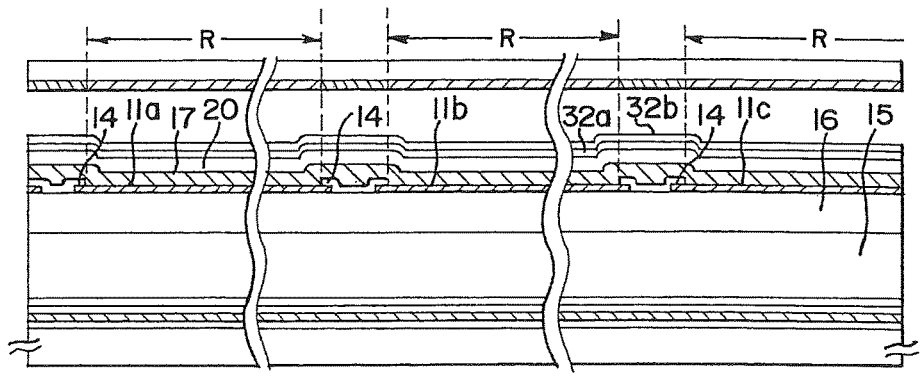
Figure 8C:
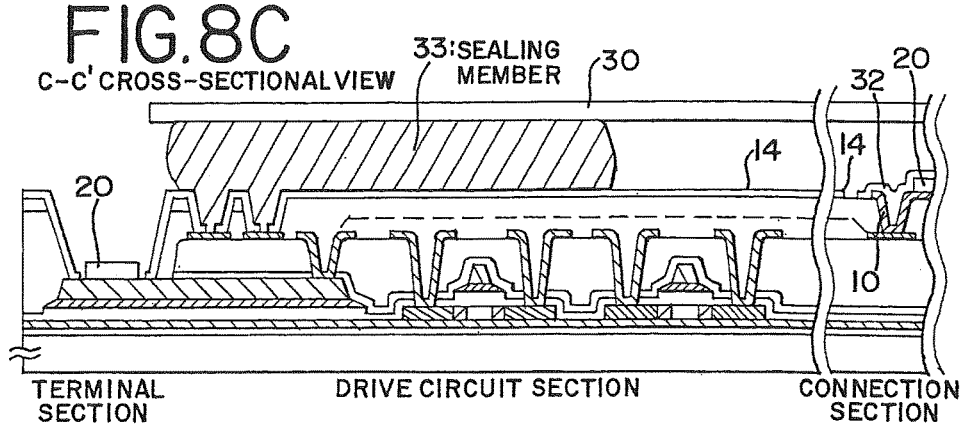

Moreover, an example whose configuration is partially different from the configuration of FIG. 1 is shown in FIG. 8. It should be noted that for simplification, in FIG. 8, the same reference numeral is used for the portion which is the same with that of FIG. 1. As shown in FIG. 8A, there is an example in which an insulator 24 (also reference to as bank, embankment or barrier) composed of an organic resin covered with the inorganic insulation film 14 is provided between the light emitting region 10R and the light emitting region 10G, and between the light emitting region 10G and the light emitting region 10B. When such an insulator 24 is formed, it is necessarily difficult to make the interval between the light emitting region 10G and the light emitting region 10B narrow depending on the patterning precision. In many cases, although the embankment is provided around each pixel, in FIG. 8, a configuration in which the embankment is provided per each pixel row is made.

Figure 9A:
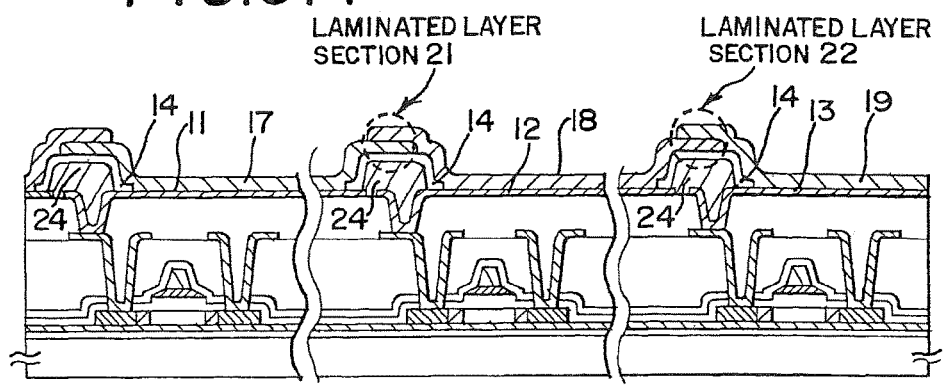
FIGS. 9A and 9B are diagrams showing sectional views (Embodiment 1)
Figure 9B:
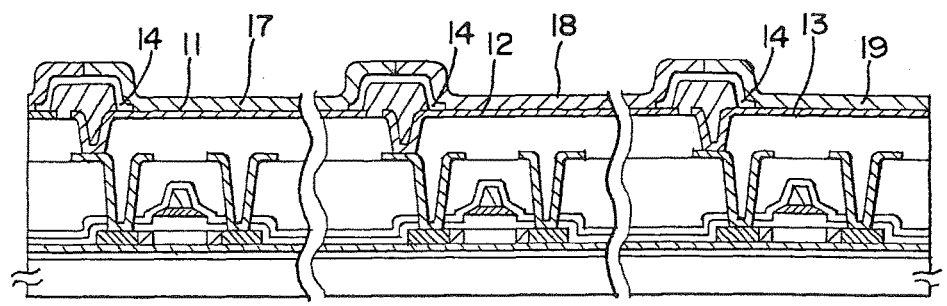

Moreover, an example in which the configuration is partially different from that of FIG. 8. For simplification, in FIG. 9, the same reference numeral is used for the same portions as in FIG. 8 and FIG. 1. In FIG. 9A, an example in which the region of the laminated section is larger than that of FIG. 8A is shown, and in FIG. 9B, it does not have the laminated section, and an example in which the ends of the organic compound layer is disposed on the insulator 24 is shown. In this way, the location of the ends of the organic compound layer is not particularly limited if it is disposed on the insulator 24.

In FIG. 1, since the insulator 24 composed of an organic resin is not provided, comparing to FIG. 8, the interval between the respective light emitting regions can be narrowed, and a high definition light emitting device can be realized.

Embodiment 2

Now, a film containing hydrogen and a protective film will be described with reference to FIG. 3 and FIG. 4 below.

A light emitting mechanism of an organic EL depends upon the mechanism in which electron and hole is implanted from the exterior and the light emitting center is excited by those recombination energy. A structure of an organic EL is typically a three-layer structure, but here the structure will be described below using a two layer structure (electron transport layer, hole transport layer). In FIG. 3A, the energy band diagram of the EL element in which an organic compound layer having a two layer structure is sandwiched by a cathode and an anode is shown in FIG. 3A.

FIG. 3A shows an ideal energy band diagram. It should be noted that here, a light emitting mechanism will be described below by exemplifying an example in which an ITO is used as an anode, and MgAg is used in the cathode.

When the direct current voltage is applied from the exterior with respect to the EL element having the above-described two layer structure, a hole is implanted from an ITO electrode which is an anode, transported to the interface with the organic compound layer, and implanted into the organic compound layer. On the other hand, an electron is implanted from the MgAg electrode, transported within the organic compound layer, reaches nearby the interface, and recombined with the hole on the light emitting molecule. As a result, the excitation state of the light emitting molecule is generated, and the emission resembling to the fluorescence spectrum of the molecule is generated.

However, it is expected that the energy band diagram is actually shown in FIG. 3B.

It is considered that in the organic compound layer, numerous drawbacks exist, as shown in FIG. 3B, a level is formed. In the case where an electron is trapped in this drawback, the light emitting efficiency is lowered. In the case where it is trapped, it is deactivated through a variety of pathways, for example, it becomes a thermal quenching or an emission of infrared light. The causing factor of the drawback is considered that it is because a dangling bond or unstable bond exists. For example, in the case where a material constituting the organic compound layer contains carbon atoms and a dangling bond of the carbon atom also makes the EL element continuously emit the light, it is considered that the heat due to the emission breaks the unstable bond, then dangling bond may be generated, the drawbacks may be increased by chemical reaction being generated to cause aging degradation.

Then, the present inventor finds that this drawbacks is neutralized with hydrogen (hydrogen radical), and an inter-band transition is caused more efficiently to increase brightness, and further the degradation is prevented. As a means of the hydrogen neutralization, in forming a hydrogen containing film covering the EL element, a method of implanting hydrogen into an organic compound layer, or a method of generating plasma in a hydrogen atmosphere, or a method of addition by ion doping or ion implantation are enumerated.

Moreover, in the case where an EL element emits and an unstable bond in the organic compound layer is broken and a dangling bond is generated, if a film containing hydrogen is disposed nearby the organic compound layer, then the unpaired bond generated can be terminated with hydrogen and the deterioration can be suppressed. It should be noted that hydrogen is an atom easily diffused even at a comparatively low temperature.

Hereinafter, a representative example in which a film containing hydrogen covering the EL element is formed is shown in FIG. 4. FIG. 4A is a schematic diagram showing an example of a laminated structure of an EL element. In FIG. 4A, the reference numeral 200 denotes an anode (or cathode), the reference numeral 201 denotes an EL layer, the reference numeral 202 denotes a cathode (or anode), the reference numeral 203 denotes a DLC film containing hydrogen, the reference numeral 204 denotes a protective film. Moreover, in the case where the emission is made in the direction of the arrow in the FIG. 4 A (in the case where the emission is made pass through the anode 202), it is preferable that for the reference numeral 202, a conductive material having a translucent property or a very thin metal film (alloy such as MgAg, MgIn, AlLi, CaN, or a film formed using an element belonging to 1 Group or 2 Group of the periodic table and aluminum by co-vapor deposition method), or the laminated layer thereof is used.

For the protective film 204, an insulation film whose major component is silicon nitride or oxynitride silicon obtained by a sputtering method (DC method or RF method) may be used. If it is formed with atmosphere containing nitrogen and argon using a silicon target, silicon nitride film is obtained. Moreover, a silicon nitride target may be also used. Moreover, the protective film 204 may be formed using a film formation unit using a remote plasma. Moreover, in the case where the emitted light is made pass through the protective film, it is preferable that the film thickness of the protective film is made as thin as possible. Moreover, the DLC film 203 containing hydrogen contains 70-95 atom % of carbon and 5-30 atom % of hydrogen, very hard and excellent in insulating property. The DLC film containing hydrogen can be formed by a plasma CVD method (representatively, RF plasma CVD method, microwave CVD method, electron cyclotron resonance (ECR) CVD method and the like), a sputtering method and the like.

As a method of forming the DLC film 203 containing hydrogen, there is a method in which the DLC film is formed in the temperature range where the foregoing organic compound layer is durable, for example, in the range from room temperature to 100° C. or less. For the reactant gas used for forming a film in the case where plasma is generated, hydrogen gas and hydrocarbon based gas (for example, $CH_4$, $C_2H_2$, $C_6H_6$ and the like) may be used.

The drawback in an organic compound layer can be terminated with hydrogen by diffusing hydrogen from the above-described DLC film containing hydrogen by means of performing the heating treatment in a temperature range where the organic compound layer is durable or by means of utilizing the heat generation generated at the time when the light emitting element emits the light. Once the drawback in the organic compound layer is terminated with hydrogen, the reliability and the brightness are enhanced as a light emitting device. Moreover, when the above-described DLC film containing hydrogen is formed in a film, the drawback in the organic compound layer may be also terminated with hydrogen which has been made plasmatic. Moreover, the protective layer for covering and forming the DLC film containing hydrogen blocks hydrogen diffusing to the protective layer side and efficiently diffusing hydrogen into an organic compound layer and plays a role for terminating the drawback in the organic compound layer with hydrogen. It should be noted that the above-described DLC film containing hydrogen can be functioned as a protective film of a light emitting element. Furthermore, the above-described DLC film containing hydrogen can be functioned as a buffer layer, in the case where a silicon nitride film is formed in a state where it is contacted with a film composed of a transparent conductive film by a sputtering method, it is feared that impurities (In, Sn, Zn and the like) contained in the transparent conductive film is contaminated into the silicon nitride film. However, the impurities contamination into the silicon nitride film can be prevented by forming the above-described DLC film containing hydrogen which is to be a buffer layer between two films. Due to the above-described constitution, buffer layer is formed and thus contamination of impurities (In, Sn and the like) from the transparent conductive film can be prevented, and an excellent protective film without any impurities can be formed.

By thus configuring, the reliability and the brightness can be enhanced as well as the light emitting element is protected. Moreover, FIG. 4B is a schematic diagram showing another example of a laminated structure of an EL element. In FIG. 4B, the reference numeral 300 denotes an anode (or cathode), the reference numeral 301 denotes an EL layer, the reference numeral 302 denotes a cathode (or anode), the reference numeral 303 denotes a silicon nitride film containing hydrogen, the reference numeral 304 denotes a protective film. Moreover, in the case where the emission is made in the direction of the arrow in the FIG. 4 B (in the case where the emission is made pass through the anode 302), it is preferable that for the reference numeral 302, a conductive material having a translucent property or a very thin metal film (MgAg), or the laminated layer thereof is used.

For the protective film 304, an insulation film whose major component is silicon nitride or silicon oxynitride obtained by a sputtering method (DC method or RF method) may be used. If it is formed under the atmosphere containing nitrogen and argon using a silicon target, silicon nitride film is obtained. Moreover, a silicon nitride target may be used. And, the protective film 304 may be formed using a film formation unit using a remote plasma. Moreover, in the case where the emitted light is made pass through the protective film, it is preferable that the film thickness of the protective film is made as thin as possible.

Moreover, the silicon nitride film 303 containing hydrogen can be formed by a plasma CVD method (representatively, RF plasma CVD method, microwave CVD method, electron cyclotron resonance (ECR) CVD method and the like), a sputtering method and the like. As a method of forming the silicon nitride film 303 containing hydrogen, there is a method in which the film is formed in the temperature range where the foregoing organic compound layer is durable, for example, in the range from room temperature to 100° C. or less.

As a method of forming the silicon nitride film 303 containing hydrogen, in the case where a plasma CVD method is used, for the reactant gas, gas containing nitrogen (nitrogen oxide based gas represented by $N_2$,$NH_3NO_x$ or the like) and hydrogen silicide based gas (for example, silane ($SiH_4$) and disilane and trisilane or the like) may be used.

As a method of forming the silicon nitride film 303 containing hydrogen, in the case where a sputtering method is used, a silicon target is used, and if it is formed under the atmosphere containing hydrogen, nitrogen and argon, a silicon nitride film containing hydrogen can be obtained. Moreover, a silicon nitride target may be used.

The drawback in an organic compound layer can be terminated with hydrogen by diffusing hydrogen from the above-described silicon nitride film containing hydrogen by means of performing the heating treatment in a temperature range where the organic compound layer is durable or by means of utilizing the heat generation generated at the time when the light emitting element emits the light. Once the drawback in the organic compound layer, dangling bond is terminated with hydrogen, the reliability and the brightness are enhanced as a light emitting device. Moreover, when the above-described silicon nitride film containing hydrogen is formed in a film, the drawback in the organic compound layer may be also terminated with hydrogen which has been made plasmatic. Moreover, the protective layer for covering and forming the silicon nitride film containing hydrogen blocks hydrogen diffusing to the protective layer side and efficiently diffusing hydrogen into an organic compound layer and plays a role for terminating the drawback in the organic compound layer with hydrogen. It should be noted that the above-described silicon nitride film containing hydrogen could be functioned as a protective film of a light emitting element.

Furthermore, the above-described silicon nitride film containing hydrogen can be functioned as a buffer layer, in the case where the silicon nitride film is formed in a state where it is contacted with a film composed of a transparent conductive film by a sputtering method, it is feared that impurities (In, Sn, Zn and the like) contained in the transparent conductive film is contaminated into the silicon nitride film. However, the impurities contamination into the silicon nitride film can be prevented by forming the above-described silicon nitride film containing hydrogen which is to be a buffer layer between two films. The contamination of impurities (In, Sn and the like) from the transparent conductive film is prevented and an excellent protective film without any impurities can be formed by forming the buffer layer according to the above-described configuration. By thus configuring, the reliability and the brightness can be enhanced as well as the light emitting element is protected. Moreover, FIG. 4C is a schematic diagram showing another example of a laminated structure of an EL element. In FIG. 4C, the reference numeral 400 denotes an anode (or cathode), the reference numeral 401 denotes an EL layer, the reference numeral 402 denotes a cathode (or anode), the reference numeral 403 denotes a film containing hydrogen, the reference numeral 404 denotes a protective film. Moreover, in the case where the emission is made in the direction of the arrow in FIG. 4 C (in the case where the emission is made pass through the cathode 402), it is preferable that for the reference numeral 402, a conductive material having a translucent property is used.

For the protective film 404, an insulation film whose major component is silicon nitride or silicon oxynitride obtained by a sputtering method (DC method or RF method) may be used. If it is formed under the atmosphere containing nitrogen and argon using a silicon target, silicon nitride film is obtained. Moreover, the protective film 404 may be also formed using a film formation unit using remote plasma. Moreover, in the case where the emitted light is made pass through the protective film, it is preferable that the film thickness of the protective film is made as thin as possible.

Moreover, the film 403 containing hydrogen can be formed using reactant gas containing hydrogen by a plasma CVD method (representatively, RF plasma CVD method, microwave CVD method, electron cyclotron resonance (ECR) CVD method and the like), a sputtering method and the like.

As for the film 403 containing hydrogen, it is made a DLC film, a silicon nitride film, a silicon oxynitride film, a silicon oxide film or a laminated film thereof.

As a method of forming the film 403 containing hydrogen, there is a method in which the film is formed in the temperature range where the foregoing organic compound layer is durable, for example, in the range from room temperature to 100° C. or less.

The drawback in an organic compound layer can be terminated with hydrogen by diffusing hydrogen from the above-described silicon nitride film containing hydrogen by means of performing the heating treatment in a temperature range where the organic compound layer is durable or by means of utilizing the heat generation generating at the time when the light emitting element emits the light. Once the drawback in the organic compound layer, representatively, dangling bond is terminated with hydrogen, the reliability and the brightness are enhanced as a light emitting device. Moreover, when the above-described silicon nitride film containing hydrogen is formed, the drawback in the organic compound layer may be also terminated with hydrogen which has been made plasmatic. Moreover, the protective layer for covering and forming the silicon nitride film containing hydrogen blocks hydrogen diffusing to the protective layer side and efficiently diffuses hydrogen into an organic compound layer and plays a role for terminating the drawback in the organic compound layer with hydrogen.

Furthermore, the above-described film 403 containing hydrogen can be functioned as a buffer layer of the protective film 404, and in the case where a protective film composed of a silicon nitride film is formed in a state where it is in contact with a film composed of a transparent conductive film by a sputtering method, it is feared that impurities (In, Sn, Zn and the like) contained in the transparent conductive film are contaminated into the silicon nitride film, but the impurities contamination into the silicon nitride film can be prevented by forming the above-described silicon nitride film containing hydrogen which is to be a buffer layer between two films. The contamination of impurities (In, Sn and the like) from the transparent conductive film is prevented and an excellent protective film without any impurities can be formed by forming the buffer layer according to the above-described configuration.

By thus configuring, the reliability and the brightness can be enhanced as well as the light emitting element is protected. Moreover, although in FIGS. 4A to 4C, an example in which a film containing hydrogen is made a monolayer is shown, but it may be also a laminated layer of a silicon nitride film containing hydrogen and a DLC film containing hydrogen or a laminated layer of these 3 layers or more.

Moreover, the present embodiment can be applied to not only an active matrix type display device, but also a passive type display device.

Moreover, the present embodiment can be freely combined with Embodiment 1.

Embodiment 3

Figure 5A:
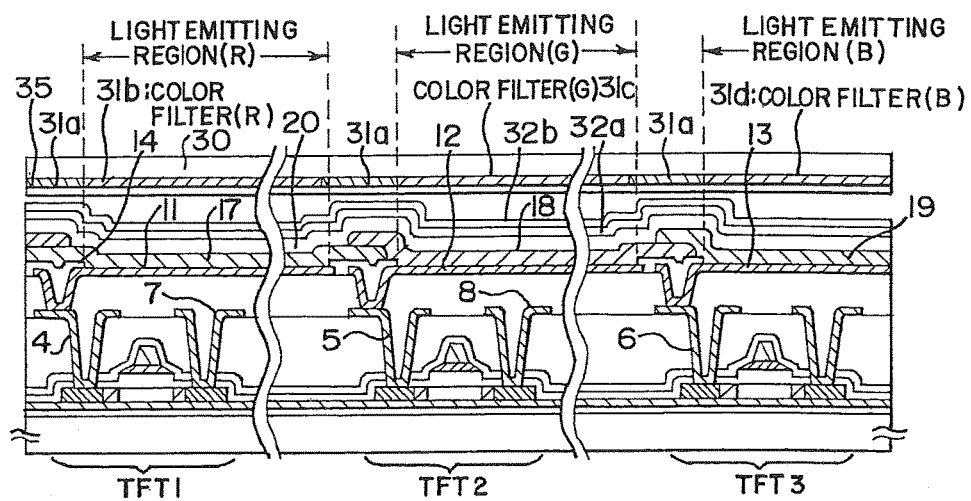
FIGS. 5A and 5B are diagrams showing sectional view (Embodiment 3)
Figure 5B:
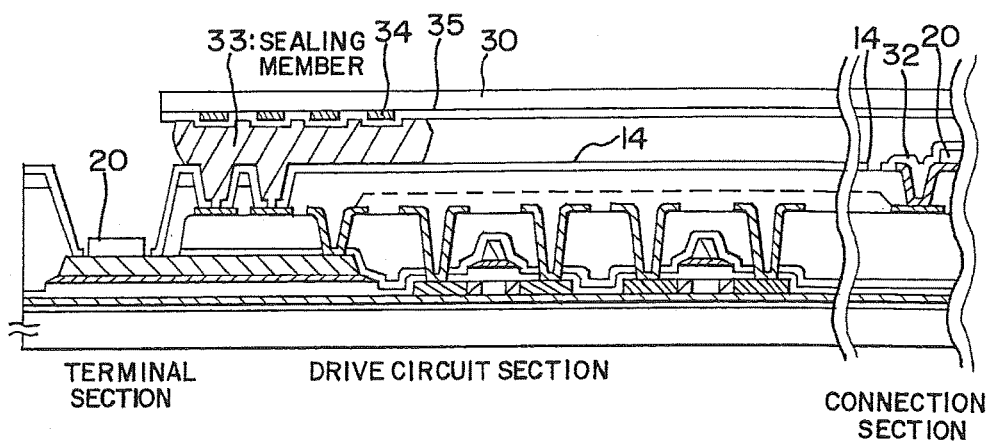

Now, an example whose configuration is partially different from the configuration of FIG. 1 is shown in FIG. 5. It should be noted that for simplification, in FIG. 5, the same reference numeral is used for the portion which is the same with that of FIG. 1. In FIG. 5A, an example in which it is made a structure where the impurities from the color filters 31a-31d are prevented from diffusing by covering the sealing substrate 30 with the film 35 whose major component is silicon nitride is exemplified. Moreover, FIG. 5B is a diagram corresponding to FIG. 1C, but in order to enhance the adhesion of the sealing member 33, the convex portion 24 is formed with the same material with those of the color filters 31a-31d.

Moreover, the present Embodiment can be freely combined with Embodiment 1 or Embodiment 2.

Embodiment 4

Now, an example of a fabrication unit (multi-chamber method) by which the laminated structure of FIG. 4A, the laminated structure of FIG. 4B and the laminated structure of FIG. 4C can be separately made is shown in FIG. 6.

In FIG. 6, the reference numerals and characters 100a-100k, 100m-100v denote gates, the reference numerals 101, 119 denote delivery chambers, the reference numerals and characters 102, 104a, 107, 108, 111, and 114 denote carrier chambers, the reference numerals and characters 105, 106R, 106B, 106G, 106H, 109, 110, 112 and 113 denote film forming chambers, the reference numeral 103 denotes a pretreatment chamber, the reference numerals and characters 117a, 117b denote sealing substrate loading chambers, the reference numeral 115 denotes a dispenser chamber, the reference numeral 116 denotes a sealing chamber, the reference numeral 118 denotes a ultraviolet ray irradiation chamber, and the reference numeral 120 denotes a substrate inversion chamber. Hereinafter, the procedure by which the substrate on which the TFT has been previously provided is carried into the fabrication unit shown in FIG. 6, the laminated structure shown in FIG. 4A is formed will be described.

First, the substrate on which the TFT and the anode 200 are provided is set in the delivery chamber 101. Subsequently, it is transported to the carrier chamber 102 connected to the delivery chamber 101. It is preferable that after moisture and oxygen are previously vacuum-pumped so that the moisture and oxygen do not exist within the carrier chamber, an inert gas is introduced and set at the atmospheric pressure.

Moreover, the carrier chamber 102 is connected to a vacuum pumping treatment chamber for vacuum-pumping within the carrier chamber. The vacuum pumping treatment chamber is equipped with a magnetic levitated type turbo molecular pump, cryopump, or dry pump. By utilizing this, it is possible to make the ultimate pressure of the carrier chamber be $10^{-5}$-$10^{-6}$ Pa, and further, reverse diffusion of impurities from the pump side and exhaust system can be controlled. In order to prevent impurities from being introduced into the interior of the device, for a gas to be introduced, an inert gas such as nitrogen and rare gas and the like are used. For these gases introduced into the device, gases highly purified by a gas purifier prior to the introduction into the interior of the device are used. Therefore, it is required that a gas purifier is implemented so that the gas is introduced into the film forming chamber following the high purification of the gas. Since by utilizing this, oxygen, moisture and the other impurities contained in the gas can be previously removed, it can prevent the impurities from being introduced into the interior of the device.

Moreover, in order to remove the moisture and the other gases contained in the substrate, it is preferable that the annealing for degassing is carried out under the vacuum, and it is transported to the pretreatment chamber 103 connected to the carrier chamber 102 and the annealing may be carried out there. Furthermore, if it is necessary to clean the surface of the anode, it is transported to the pretreatment chamber 103 connected to the carrier chamber 102, then, the cleaning may be carried out there.

Moreover, if it is necessary, an organic compound layer composed of a polymer molecule may be formed on the whole surface of the anode. In the fabrication unit of FIG. 6, the film forming chamber 105 is provided for forming the organic compound layer composed of the polymer molecule. In the case where it is formed by a spin coat method, an ink jet method and a spray method, the surface of the substrate to be film-formed is set under the atmospheric pressure in the overhead position. The substrate is appropriately rotated inversely in the substrate inversion chamber 120 provided between the film forming chamber 105 and the carrier chamber 102. Moreover, it is preferable that after the film formation has been carried out using the solution, it is transported to the pretreatment chamber 103, where the heating treatment is carried out under the vacuum and the solvent (water and the like) is vaporized.

Subsequently, without being in contact with the atmosphere, after the substrate 104c has been transported to the carrier chamber 104 from the carrier chamber 102, it is transported to the film forming chamber 106R by the carrier mechanism 104b, and an EL layer which emits the red color is appropriately formed on the anode 200. Here, an example in which it is formed by vapor deposition is shown. The surface to be film-formed of the substrate is set in an underhead position in the substrate inversion chamber 120 and carried into the film forming chamber 106R. It should be noted that it is preferable that it has been previously vacuum-pumped within the film forming chamber prior to the carrying-in of the substrate.

For example, the vapor deposition is carried out in the film forming chamber 106R which has been vacuum-pumped to the degree of vacuum of $5 \times 10^{-3}$ Torr (0.665 Pa) or less, and preferably, to the degree of vacuum of $10^{-4}$-$10^{-6}$ Pa. Upon the vapor deposition, the organic compound has been previously vaporized by the resistance heating, it flies away toward the direction of the substrate by the shutter (not shown) being opened at the time when the vapor deposition is carried out. An organic compound vaporized flies away upwardly, it is vapor deposited on the substrate through the opening (not shown) provided on the metal mask (not shown). It should be noted that upon the vapor deposition, the temperature of the substrate ($T_1$) is made in the range from 50 to 200° C., preferably, in the range from 65 to 150° C. by means of heating the substrate. In order to make it be the full color specification, in the case where three kinds of EL layers are formed, after it has been formed in the film forming chamber 106R, the film formation may be in turn carried out in the respective film forming chamber 106G and 106B.

When the desired EL layer 201 has been obtained on the anode 200, subsequently, after the substrate is transported to the carrier chamber 107 from the carrier chamber 104 without being in contact with the atmosphere, and further, the substrate is transported to the carrier chamber 108 from the carrier chamber 107 without being in contact with the atmosphere.

Subsequently, after it has been transported to the film forming chamber 110 by the carrier mechanism provided within the carrier chamber 108, and a thin metal layer has been formed on the EL layer 201, it is transported to the film forming chamber 109 and the transparent conductive film is formed, the cathode 202 composed of the laminated layer of the thin metal layer and the transparent conductive film is appropriately formed. Here, the film forming chamber 110 is made a vapor deposition device equipped with a vapor deposition source of Mg and Ag, and the film forming chamber 109 is made a sputtering device having at least a target comprising a transparent conductive material.

Subsequently, it is transported to the film forming chamber 112 by the carrier mechanism provided within the carrier chamber 108, the DLC film 203 containing hydrogen in the temperature range where the organic compound layer is durable is formed. Here, the film forming chamber 112 is equipped with a plasma CVD device, and as for the reactant gas used for forming a film, a DLC film is formed using hydrogen gas and hydrocarbon based gas (for example, $CH_4$, $C_2H_2$, $C_6H_6$ and the like). Moreover, instead of the DLC film, a silicon nitride film containing hydrogen is formed, and the structure shown in FIG. 4B may be formed. It should be noted that the structure is not particularly limited if it is equipped with the means for generating hydrogen radical, and at the time when the above-described DLC film containing hydrogen is formed, the drawback in the organic compound layer is terminated with hydrogen which has been made plasmatic.

Subsequently, it is transported to the film forming chamber 113 from the carrier chamber 108 and the protective film 204 is formed on the DLC film 203 containing hydrogen. Here, it is made a sputtering device equipped with a target composed of silicon or a target composed of silicon nitride. A silicon nitride film can be formed by making the film forming chamber under the nitrogen atmosphere or by making it under the atmosphere containing nitrogen and argon.

In the above-described steps, the laminated structure shown in FIG. 4A, that is, a light emitting element covered by the protective film and the DLC film containing hydrogen is formed on the substrate.

Subsequently, the substrate on which the light emitting element is formed is transported to the carrier chamber 111 from the carrier chamber 108 without being in contact with the atmosphere and further, it is transported from the carrier chamber 111 into the carrier chamber 114.

Subsequently, the substrate on which the light emitting element is formed is transported from the carrier chamber 114 to the sealing chamber 116. It should be noted that it is preferable that the sealing substrate on which a sealing member is provided has been previously prepared for in the sealing chamber 116.

The sealing substrate is set in the sealing substrate loading chambers 117a, 117b from the exterior. It should be noted that it is preferable that the annealing has been previously carried out under the vacuum in order to remove the impurities such as water or the like, for example, the annealing is carried out within the sealing substrate loading chambers 117a, 117b. Then, in the case where the seal member is formed on the sealing substrate, after it is set at the atmospheric pressure in the carrier chamber 108, the sealing substrate is transported from the sealing substrate loading chamber to the dispenser chamber 115, a seal member for pasting it with the substrate on which the light emitting element is provided is formed, the sealing substrate on which the sealing member has been formed is transported to the sealing chamber 116.

Subsequently, in order to degas the substrate on which the light emitting element has been provided, after the annealing has been carried out under the vacuum or under the inert atmosphere, the sealing substrate on which the sealing member has been provided and the substrate on which the light emitting element has been formed are pasted together. Moreover, hydrogen or an inert gas is filled in the space sealed. It should be noted that here, an example in which the sealing member has been formed on the sealing substrate is shown, but it is not particularly limited to that, and the sealing member may be formed on the substrate on which the light emitting element has been formed.

Subsequently, a pair of substrates pasted together is transported from the carrier chamber 114 to the ultraviolet ray irradiation chamber 118. Subsequently, the ultraviolet (UV) ray is irradiated in the ultraviolet ray irradiation chamber 118 and the sealing member is hardened. It should be noted that here, using the ultraviolet ray hardened resin as a sealing member, but it is not particularly limited to that if it is adhesive member.

Subsequently, it is transported from the carrier chamber 114 to the delivery chamber 119 and it is unloaded.

As described above up to here, since the light emitting element is not exposed to the ambient air until the light emitting element is completely enclosed in the sealed space by using the fabrication unit shown in FIG. 6, it is possible to prepare a highly reliable light emitting device. It should be noted that in the carrier chambers 102, 114, the vacuum and the atmospheric pressure are alternately changed and this procedure is repeated, but the vacuum is continuously maintained in the carrier chambers 104a and 108. It should be noted that it is possible to make it a film forming device of in-line method.

Hereinafter, the procedure by which the substrate on which the TFT and anode have been previously provided is carried into the fabrication unit shown in FIG. 6, and the laminated structure shown in FIG. 4C is formed is described.

First, the substrate on which the TFT and the anode 400 are provided is set in the delivery chamber 101. Subsequently, it is transported to the carrier chamber 102 connected to the delivery chamber 101. It is preferable that after it has been vacuum-pumped so that the moisture and oxygen do not exist as far as possible within the carrier chamber, an inert gas is introduced and set at the atmospheric pressure. For a material for forming the anode 400, a transparent conductive material is used, indium tin compound or zinc oxide and the like can be used. Subsequently, it is carried into the pretreatment chamber 103 connected to the carrier chamber 102. In this pretreatment chamber, the cleaning, the oxide treatment, heating treatment and the like of the surface of the anode may be carried out. As the cleaning of the surface of the anode, the ultraviolet ray irradiation under the vacuum, or oxygen plasma treatment is carried out, thereby cleaning the surface of the anode. Moreover, as an oxide treatment, the ultraviolet ray may be irradiated under the atmosphere containing oxygen while it is heated in the range from 100 to 120° C., and in the case where the anode is an oxide like an ITO, it is effective. Moreover, as a heating treatment, the heating may be carried out at the heating temperature at 50° C. or more where the substrate is durable under the vacuum, preferably, the heating may be carried out at 65-150° C., and the impurities such as oxygen, moisture and the like attached to the substrate and impurities such as oxygen, moisture and the like in the film formed on the substrate are removed. Since particularly, an EL material is easily subjected to the deterioration by the impurities such as oxygen, water and the like, the heating under the vacuum prior to the vapor deposition is effective.

If it is necessary, after the substrate 104c has transported from the carrier chamber 102 into the carrier chamber 104 without being in contact with the atmosphere, it is transported to the film forming chamber 105 by the carrier mechanism 104b, and a hole transport layer, a hole implantation layer or the like which is one layer of the EL layer is appropriately laminated and formed on the anode 400. Here, an example in which it is formed by vapor deposition is shown. The surface to be film-formed of the substrate is set in an underhead position in the film forming chamber 105. It should be noted that it is preferable that it has been previously vacuum-pumped within the film forming chamber prior to the carrying-in of the substrate.

Subsequently, it is transported to the film forming chamber 106R, and an EL layer which emits red color is appropriately formed on the anode 400. Here, an example in which it is formed by a vapor deposition method is shown. The surface to be film formed of the substrate is set in an underhead position in the substrate inversion chamber 120 and carried into the film forming chamber 106R. It should be noted that it is preferable that it has been previously vacuum-pumped within the film forming chamber prior to the carrying-in of the substrate.

For example, the vapor deposition is carried out in the film forming chamber 106R which has been vacuum-pumped to the degree of vacuum of $5\times10^{-3}$ Torr (0.665 Pa) or less, and preferably, to the degree of vacuum of $10^{-4}$-$10^{-6}$ Pa. Upon the vapor deposition, the organic compound has been previously vaporized by performing the resistance heating, it flies away toward the direction of the substrate by the shutter (not shown) being opened at the time when the vapor deposition is carried out. An organic compound vaporized flies away upward, it is vapor deposited on the substrate through the opening (not shown) provided on the metal mask (not shown). It should be noted that upon the vapor deposition, the temperature of the substrate ($T_1$) is made in the range from 50 to 200° C., preferably, in the range from 65 to 150° C. by means of heating the substrate.

In order to make it be the full color specification, in the case where three kinds of EL layers are formed, after it has been formed in the film forming chamber 106R, the film formation may be in turn carried out in the respective film forming chamber 106G and 106B.

When the desired EL layer 401 has been obtained on the anode 400, subsequently, after the substrate is transported to the carrier chamber 107 from the carrier chamber 104 without being in contact with the atmosphere, and further, the substrate is transported to the carrier chamber 108 from the carrier chamber 107 without being in contact with the atmosphere.

Moreover, if it is necessary, poly(ethylenedioxythiophene)/poly (stylenesulfonic acid) aqueous solution (PEDOT/PSS) which acts as a hole implantation layer may be formed on the whole surface prior to the formation of the cathode. In the fabrication unit shown in FIG. 6, the film forming chamber 105 for forming the organic compound layer composed of the polymer molecule is provided. In the case where it is formed by a spin coat method, an ink jet method and a spray method, the surface of the substrate to be film-formed is set under the atmospheric pressure in the overhead position. The substrate is appropriately inversed in the substrate inversion chamber 120 provided between the film forming chamber 105 and the carrier chamber 102. Moreover, it is preferable that after the film formation has been carried out using the aqueous solution, it is transported to the pretreatment chamber 103, where the heating treatment is carried out under the vacuum and the moisture is vaporized.

Subsequently, it is transported to the film forming chamber 110 by the transportation mechanism provided within the carrier chamber 108 and the cathode 402 composed of a metal layer is formed on the EL layer 401. Here, the film forming chamber 110 is made a vapor deposition device in which a vapor deposition source is equipped with AlLi.

Subsequently, it is transported to the film forming chamber 112 by the carrier mechanism provided within the carrier chamber 108, and the film 403 containing hydrogen is formed in the temperature range where the organic compound layer is durable. Here, the film forming chamber 112 is equipped with a plasma CVD device, and as for the reactant gas used for forming a film, appropriately using hydrogen gas and hydrocarbon based gas or a hydrogen silicide based gas, a film composed of a DLC film, a silicon nitride film, silicon oxynitride film, a silicon oxide film or a laminated layer thereof is formed. It should be noted that it is not particularly limited if it is equipped with means for generating hydrogen radical, at the time when the above-described film containing hydrogen is formed, the drawback in the organic compound layer is terminated with hydrogen which has been made plasmatic.

Subsequently, without being contact with the atmosphere it is transported to the film forming chamber 113 from the carrier chamber 108 and the protective film 404 is formed on the film 403 containing hydrogen. Here, in the film forming chamber 113 it is made a sputtering device equipped with a target composed of silicon or a target composed of silicon nitride. A silicon nitride film can be formed by making the film forming chamber under the nitrogen atmosphere or by making it under the atmosphere containing nitrogen and argon.

In the above-described steps, the laminated structure shown in FIG. 4C, that is, a light emitting element covered by the protective film and the film containing hydrogen is formed on the substrate. Since the following steps are the same with the procedure by which the laminated structure shown in FIG. 4A is formed, here, the description is omitted.

In this way, if the fabrication unit shown in FIG. 6 is used, the laminated structures shown in FIGS. 4A to 4C can be separately fabricated.

Moreover, the fabrication unit which is partially different from that shown in FIG. 6 is shown in FIG. 7.

In FIG. 6, there is an example in which only one film forming chamber for forming a film by a spin coat method, an ink jet method and a spray method is provided. However, the fabrication unit shown in FIG. 7 is an example with which three film forming chambers for forming a film by a spin coat method, an ink jet method and a spray method are equipped. For example, in order to make it full color specification, in the case where three kinds of EL layers are formed by a spin coat method, a ink jet method and a spray method, after it has been formed in the film forming chamber 121a, the film formation may be in turn carried out in the respective film forming chambers 121b and 121c. Moreover, it is preferable that after the film formation has been carried out using a spin coat method, an ink jet method, and a spray method, it is transformed to the pretreatment chamber 103, where the heating treatment is carried out under the vacuum and the moisture is vaporized. Moreover, the present Embodiment can be freely combined with Embodiment 1, Embodiment 2 or Embodiment 3.

Embodiment 5

Figure 11A:
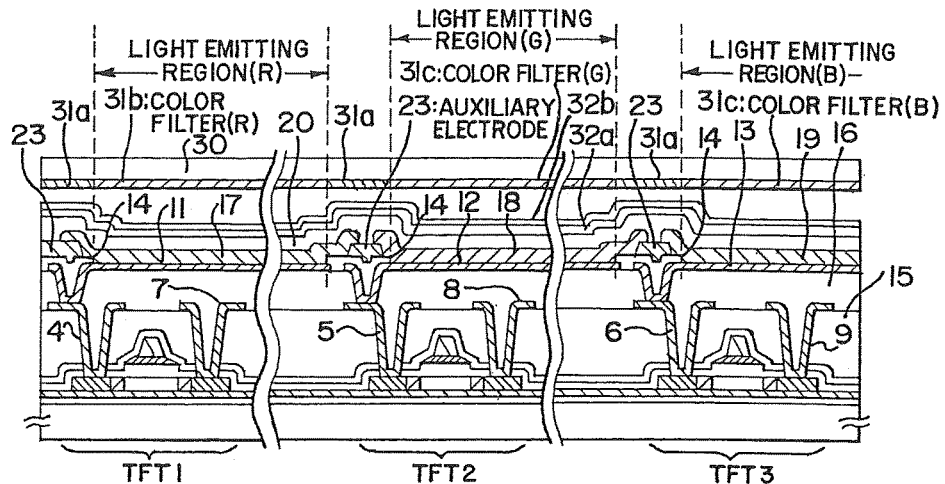
FIGS. 11A to 11C are diagrams showing sectional views (Embodiment 5)
Figure 11B:
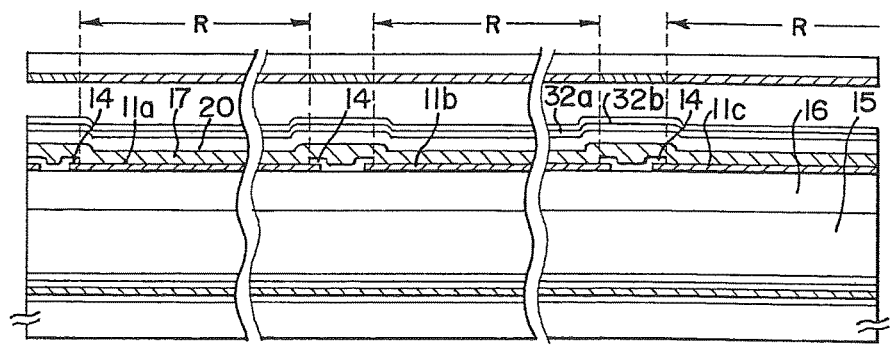

Now, an example whose configuration is partially different from the configuration of FIG. 1 is shown in FIG. 11. It should be noted that for simplification, in FIG. 11, the same reference numeral is used for the portion which is the same with that of FIG. 1. In FIG. 11A, there is provided an example in which an auxiliary electrode 23 is formed on the inorganic insulation film 14. This auxiliary electrode 23 functions as one portion of a cathode (or anode). Since the resistance of the cathode 20 composed of a transparent conductive electrode is comparatively high, it is difficult to make it a large screen, but a cathode (or anode) as a whole can be made low resistance. In addition, the transparent conductive film can be made thinner.

Figure 11C:
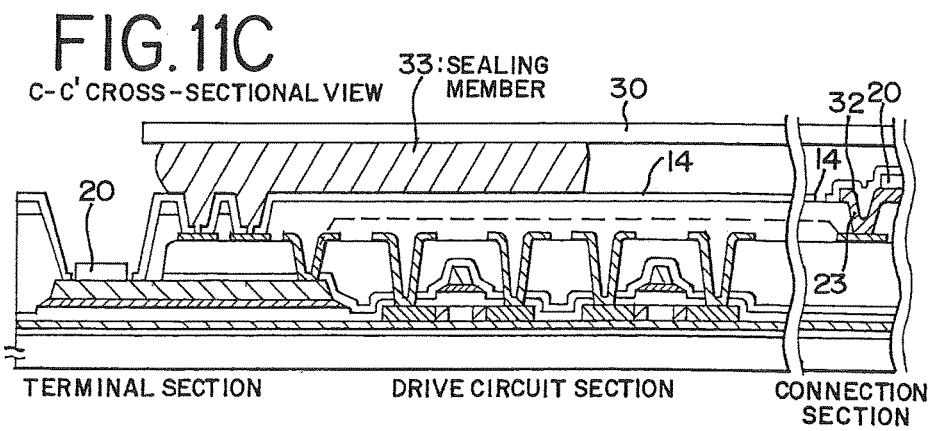

Furthermore, it is connected to the wirings and electrodes of the lower layers through this auxiliary electrode 23. This auxiliary electrode 23 may be formed in a film and patterned prior to the formation of an EL layer. The auxiliary electrode 23 may be formed with an element selected from W, WSi$_x$, Al, Ti, Mo, Cu, Ta, Cr, Ni, Mo, or poly-Si which has been doped with impurities for conferring the conductive type by utilizing a sputtering method, a vapor deposition method or the like or an alloy material whose major component is the foregoing elements or a film whose major component is a compound material, or a laminated film thereof. In this way, if the transparent conductive film is formed while being in contact with and superimposed on the auxiliary electrode 23 which has been made contacted with the electrode of the lower layer, the drawing of the cathode can be realized. It should be noted that FIG. 11C is a sectional view taken on chain line C-C' shown in FIG. 2. Moreover, in FIG. 11C, it is shown that the electrodes shown in dotted line are electrically connected each other. Moreover, in the terminal portion, the electrode of the terminal is formed with the same materials with those of the cathode 20.

Moreover, the present Embodiment can be freely combined with Embodiment 1, Embodiment 2, Embodiment 3 or Embodiment 4. The present invention comprising the above-described configurations will be further described in detail with reference to examples shown in the following.

EXAMPLES

Example 1

In this example, an active matrix type light emitting device manufactured on an insulating film will be described. FIG. 12 is a cross sectional view of the active matrix type light emitting device. As an active element, a thin film transistor (hereafter referred to as a TFT) is used here, a MOS transistor may also be used.

A top gate TFT (specifically a planar TFT) is shown as an example of a TFT, a bottom gate TFT (typically inversely staggered TFT) may also be used.

In this example, a substrate 800 is used, which is made of barium borosilicate glass or alumino borosilicate glass, a quartz substrate, a silicon substrate, a metal substrate, or stainless substrate forming an insulating film on the surface may be used. A plastic substrate having heat resistance enduring a treatment temperature of this example also may be used, and further a flexible substrate may be used.

First, a silicon oxynitride film is formed as a lower layer 801 of a base insulating film on a heat-resistant glass substrate (the substrate 800) with a thickness of 0.7 mm by plasma CVD at a temperature of 400° C. using $SiH_4$, $NH_3$, and $N_2O$ as material gas (the composition ratio of the silicon oxynitride film: Si=32%, O=27%, N=24%, H=17%). The silicon oxynitride film has a thickness of 50 nm (preferably 10 to 200 nm). The surface of the film is washed with ozone water and then an oxide film on the surface is removed by diluted fluoric acid (diluted down to 1/100). Next, a silicon oxynitride film is formed as an upper layer 802 of the base insulating film by plasma CVD at a temperature of 400° C. using $SiH_4$ and $N_2O$ as material gas (the composition ratio of the silicon oxynitride film: Si=32%, O=59%, N=7%, H=2%). The silicon oxynitride film has a thickness of 100 nm (preferably 50 to 200 nm) and is laid on the lower layer to form a laminate. Without exposing the laminate to the air, a semiconductor film having an amorphous structure (here, an amorphous silicon film) is formed on the laminate by plasma CVD at a temperature of 300° C. using $SiH_4$ as material gas. The semiconductor film (an amorphous silicon film is used here) is 54 nm (preferably 25 to 200 nm) in thickness.

A base insulating film in this example has a two-layer structure. However, the base insulating film may be a single layer or more than two layers of insulating films mainly containing silicon. The material of the semiconductor film is not limited but it is preferable to form the semiconductor film from silicon or a silicon germanium alloy ($Si_{1-x}Ge_x$ (X=0.0001 to 0.02)) by a known method (sputtering, LPCVD, plasma CVD, or the like). Plasma CVD apparatus used may be one that processes wafer by wafer or one that processes in batch. The base insulating film and the semiconductor film may be formed in succession in the same chamber to avoid contact with the air.

The surface of the semiconductor film having an amorphous structure is washed and then a very thin oxide film, about 2 nm in thickness, is formed on the surface using ozone water. Next, the semiconductor film is doped with a minute amount of impurity element (boron or phosphorus) in order to control the threshold of the TFTs. Here, the amorphous silicon film is doped with boron by ion doping in which diborane ($B_2H_6$) is excited by plasma without mass separation. The doping conditions include setting the acceleration voltage to 15 kV, the flow rate of gas obtained by diluting diborane to 1% with hydrogen to 30 sccm, and the dosage to $2\times10^{12}$ atoms/cm$^2$.

Next, a nickel acetate solution containing 10 ppm of nickel by weight is applied by a spinner. Instead of application, nickel element may be sprayed onto the entire surface by sputtering. The semiconductor film is subjected to heat treatment to crystallize it and obtain a semiconductor film having a crystal structure. The heat treatment is achieved in an electric furnace or by irradiation of intense light. When heat treatment in an electric furnace is employed, the temperature is set to 500 to 650° C. and the treatment lasts for 4 to 24 hours. Here, a silicon film having a crystal structure is obtained by heat treatment for crystallization (at 550° C. for 4 hours) after heat treatment for dehydrogenation (at 500° C. for an hour). Although the semiconductor film is crystallized here by heat treatment using an electric furnace, it may be crystallized by a lamp annealing apparatus capable of achieving crystallization in a short time. After an oxide film on the surface of the silicon film having a crystal structure is removed by diluted fluoric acid or the like, a continuous oscillating solid-state laser and the second to fourth harmonic of the fundamental wave are employed in order to obtain crystals of large grain size when crystallizing an amorphous semiconductor film. Since the laser light irradiation is conducted in the air or in an oxygen atmosphere, an oxide film is formed on the surface as a result. Typically, the second harmonic (532 nm) or third harmonic (355 nm) of a Nd:$YVO_4$ laser (fundamental wave: 1064 nm) is employed. When using a continuous wave laser, laser light emitted from a 10 W power continuous wave $YVO_4$ laser is converted into harmonic by a non-linear optical element. Alternatively, the harmonic is obtained by putting a $YVO_4$ crystal and a non-linear optical element in a resonator. The harmonic is preferably shaped into oblong or elliptical laser light on an irradiation surface by an optical system and then irradiates an irradiation object. The energy density required at this point is about 0.01 to 100 MW/cm$^2$ (preferably 0.1 to 10 MW/cm$^2$). During the irradiation, the semiconductor film is moved relative to the laser light at a rate of 10 to 2000 cm/s. Of course, although a TFT can be formed by using the silicon film having a crystalline structure before the second harmonics of the continuous oscillating $YVO_4$ laser is irradiated thereon, it is preferable that the silicon film having a crystalline structure after the laser light is irradiated thereon is used to form the TFT since the silicon film irradiated the laser light thereon has an improved crystallinity and electric characteristics of TFT are improved. For instance, although, when TFT is formed by using the silicon film having a crystalline structure before the laser light is irradiated thereon, a mobility is almost 300 cm$^2$/Vs, when TFT is formed by using the silicon film having a crystalline structure after the laser light is irradiated thereon, the mobility is extremely improved with about 500 to 600 cm$^2$/Vs. After the crystallization is conducted using nickel as a metal element that promotes crystallization of silicon, the continuous oscillating $YVO_4$ laser is irradiated thereon though, not limited thereof, after the silicon film is formed having an amorphous structure and the heat treatment is performed for dehydrogenation, and the silicon film having a crystalline structure may be obtained by the second harmonics of the continuous oscillating $YVO_4$ laser is irradiated.

The pulse oscillation laser may be used for as a substitute for the continuous oscillating laser. In the case that the excimer laser of the pulse oscillation is used, it is preferable that the frequency is set to 300 Hz, and the laser energy density is set from 100 to 1000 mJ/cm$^2$ (typically 200 to 800 mJ/cm$^2$). Here, the laser light may be overlapped 50 to 98%.

In addition to the oxide film formed by the laser light irradiation, a barrier layer composed of an oxide film, which treated with ozone water for 120 seconds having 1 to 5 nm in total, is formed. The barrier layer here is formed using ozone water in this example but it may be formed by oxidizing the surface of the semiconductor film having a crystal structure through ultraviolet irradiation in an oxygen atmosphere, or formed by oxidizing the surface of the semiconductor film having a crystal structure through oxygen plasma treatment, or by using plasma CVD, sputtering or evaporation to form an about 1 to 10 nm thick oxide film. The oxide film formed by the laser light irradiation may be removed before the barrier layer is formed.

Next, an amorphous silicon film containing argon is formed on the barrier layer by plasma CVD or sputtering to serve as a gettering site. The thickness of the amorphous silicon film is 50 to 400 nm, here 150 nm. The amorphous silicon film is formed in an argon atmosphere with the film formation pressure to 0.3 Pa by sputtering using the silicon target.

Thereafter, heat treatment is conducted in an electric furnace at 650° C. for 3 minutes for gettering to reduce the nickel concentration in the semiconductor film having a crystal structure. Lamp annealing apparatus may be used instead of an electric furnace. Using the barrier layer as an etching stopper, the gettering site, namely, the amorphous silicon film containing argon elements is selectively removed. Then, the barrier layer is selectively removed by diluted fluoric acid. Nickel tends to move toward a region having high oxygen concentration during gettering, and therefore it is desirable to remove the barrier layer that is an oxide film after gettering.

Next, a thin oxide film is formed on the surface of the obtained silicon film containing a crystal structure (also referred to as a polysilicon film) using ozone water. A resist mask is then formed and the silicon film is etched to form island-like semiconductor layers separated from one another and having desired shapes. After the semiconductor layers are formed, the resist mask is removed.

The oxide film is removed by an etchant containing fluoric acid, and at the same time, the surface of the silicon film is washed. Then, an insulating film mainly containing silicon is formed to serve as a gate insulating film 803. The gate insulating film, here is a silicon oxynitride film (composition ratio: Si=32%, O=59%, N=7%, H=2%) formed by plasma CVD to have a thickness of 115 nm.

Next, a laminate of a first conductive film with a thickness of 20 to 100 nm and a second conductive film with a thickness of 100 to 400 nm is formed on the gate insulating film. In this example, a tantalum nitride film with a thickness of 50 nm is formed on the gate insulating film 803 and then a tungsten film with a thickness of 370 nm is laid thereon. The conductive films are patterned by the procedure shown below to form gate electrodes and wirings.

The conductive materials of the first conductive film and the second conductive film are formed by using elements selected from the group consisting of Ta, W, Ti, Mo, Al, and Cu, or alloys or compounds mainly containing the above elements. The first conductive film and the second conductive film may be semiconductor films, typically polycrystalline silicon films, doped with phosphorus or other impurity elements or may be Ag—Pd—Cu alloy films. The present invention is not limited to a two-layer structure conductive film. For example, a three-layer structure consisting of a 50 nm thick tungsten film, 500 nm thick aluminum-silicon alloy (Al—Si) film, and 30 nm thick titanium nitride film layered in this order may be employed. When the three-layer structure is employed, tungsten of the first conductive film may be replaced by tungsten nitride, the aluminum-silicon alloy (Al—Si) film of the second conductive film may be replaced by an aluminum-titanium alloy (Al—Ti) film, and the titanium nitride film of the third conductive film may be replaced by a titanium film. Alternatively, a single-layer conductive film may be used.

ICP (inductively coupled plasma) etching is preferred for etching of the first conductive film and second conductive film (first etching treatment and second etching treatment). By using ICP etching and adjusting etching conditions (the amount of electric power applied to a coiled electrode, the amount of electric power applied to a substrate side electrode, the temperature of the substrate side electrode, and the like), the films can be etched and tapered as desired. The first etching treatment is conducted after a mask made of resist is formed. The first etching conditions include applying an RF (13.56 MHz) power of 700 W to a coiled electrode at a pressure of 1 Pa, employing $CF_4$, $Cl_2$, and $O_2$ as etching gas, and setting the gas flow rate ratio thereof to 25:25:10 (sccm). The substrate side (sample stage) also receives an RF (13.56 MHz) power of 150 W to apply a substantially negative self-bias voltage. The area (size) of the substrate side electrode is 12.5 cm×12.5 cm and the coiled electrode is a disc 25 cm in diameter (here, a quartz disc on which the coil is provided). The W film is etched under these first etching conditions to taper it around the edges. Thereafter, the first etching conditions are switched to the second etching conditions without removing the mask made from resist. The second etching conditions include using $CF_4$ and $Cl_2$ as etching gas, setting the gas flow rate ratio thereof to 30:30 (sccm), and giving an RF (13.56 MHz) power of 500 W to a coiled electrode at a pressure of 1 Pa to generate plasma for etching for about 30 seconds. The substrate side (sample stage) also receives an RF power of 20 W (13.56 MHz) to apply a substantially negative self-bias voltage. Under the second etching conditions where a mixture of $CF_4$ and $Cl_2$ is used, the W film and the TaN film are etched to almost the same degree. The first etching conditions and the second etching conditions constitute the first etching treatment.

Next follows the second etching treatment with the resist mask kept in place. The third etching conditions include using $CF_4$ and $Cl_2$ as etching gas, setting the gas flow rate ratio thereof to 30:30 (sccm), and giving an RF (13.56 MHz) power of 500 W to a coiled electrode at a pressure of 1 Pa to generate plasma for etching for 60 seconds. The substrate side (sample stage) also receives an RF power of 20 W (13.56 MHz) to apply a substantially negative self-bias voltage. Then, the third etching conditions are switched to the fourth etching conditions without removing the resist mask. The fourth etching conditions include using $CF_4$, $Cl_2$, and $O_2$ as etching gas, setting the gas flow rate ratio thereof to 20:20:20 (sccm), and giving an RF (13.56 MHz) power of 500 W to a coiled electrode at a pressure of 1 Pa to generate plasma for etching for about 20 seconds. The substrate side (sample stage) also receives an RF power of 20 W (13.56 MHz) to apply a substantially negative self-bias voltage. The third etching conditions and the fourth etching conditions constitute the second etching treatment. At this stage, gate electrodes 804 having a first conductive layer 804a as the lower layer and a second conductive layer 804b as the upper layer, and wirings 805 to 807 are formed.

Next, the mask made of resist is removed for the first doping treatment to dope with the entire surface using the gate electrodes 804 to 807 as masks. The first doping treatment employs ion doping or ion implantation. Here, ion doping conditions are that the dosage is set to $1.5 \times 10^{14}$ atoms/$cm^2$, and the acceleration voltage is set from 60 to 100 kV. As an impurity element that imparts the n-type conductivity, phosphorus (P) or arsenic (As) is typically used. First impurity regions (n$^{--}$ regions) 822 to 825 are formed in a self-aligning manner.

Masks made from resist are newly formed. At this moment, since the off current value of the switching TFT 903 is lowered, the masks are formed to overlap the channel formation region of a semiconductor layer forming the switching TFT 903 of the pixel portion 901, and a portion thereof. The masks are formed to protect the channel formation region of the semiconductor layer forming the p-channel TFT 906 of the driver circuit and the periphery thereof. In addition, the masks are formed to overlap the channel formation region of the semiconductor layer forming the current control TFT 904 of the pixel portion 901 and the periphery thereof.

An impurity region (n⁻ region) that overlaps with a portion of the gate electrode is formed by conducting selectively the second doping treatment using the masks made of resist. The second doping treatment is employs ion doping or ion implantation. Here, ion doping is used, the flow rate of gas obtained by diluting phosphine ($PH_3$) with hydrogen to 5% is set to 30 sccm, the dose is set to $1.5 \times 10^{14}$ atoms/cm², and the acceleration voltage is set to 90 kV. In this case the masks made from resist and the second conductive layer serve as masks against the impurity element that imparts the n-type conductivity and second impurity regions 811 and 812 are formed. The second impurity regions are doped with the impurity element that imparts the n-type conductivity in a concentration range of $1 \times 10^{16}$ to $1 \times 10^{17}$ atoms/cm³. Here, the same concentration range as the second impurity region is referred to as an n⁻ region.

Third doping treatment is conducted without removing the masks made from resist. The third doping treatment is employs ion doping or ion implantation. As impurity elements imparts n-type conductivity, phosphorus (P) or arsenic (As) are used typically. Here, ion doping is used, the flow rate of gas obtained by diluting phosphine ($PH_3$) with hydrogen to 5% is set to 40 sccm, the dosage is set to $2 \times 10^{15}$ atoms/cm², and the acceleration voltage is set to 80 kV. In this case the masks made from resist, the first conductive layer and the second conductive layer serve as masks against the impurity element that imparts the n-type conductivity and third impurity regions 813, 814, 826 to 828 are formed. The third impurity regions are doped with the impurity element that imparts the n-type conductivity in a concentration range of $1 \times 10^{20}$ to $1 \times 10^{21}$ atoms/cm³. Here, the same concentration range as the third impurity region is referred to as an n⁺ region. After removing the resist mask and the new resist mask is formed, the fourth doping treatment is conducted. The fourth impurity regions 818, 819, 832, 833 and the fifth impurity regions 816, 817, 830, 831 are formed in which impurity elements imparts p-type conductivity are added to the semiconductor layer forming the p-channel TFT by the fourth doping treatment.

The concentration of the impurity element that imparts the p-type conductivity is set from $1 \times 10^{20}$ to $1 \times 10^{21}$ atoms/cm³ to add to the fourth impurity regions 818, 819, 832, and 833. The fourth impurity regions 818, 819, 832, and 833 being regions (n⁻⁻ regions) are already doped with phosphorus (P) in the previous step but are doped with the impurity element that imparts the p-type conductivity in a concentration 1.5 to 3 times the phosphorus concentration to obtain the p-type conductivity. Here, a region having the same concentration range as the fourth impurity regions is also called a p⁺ region.

The fifth impurity regions 816, 817, 830, and 831 are formed in the region overlaps with the taper portion of the second conductive layer. The impurity elements imparts p-type conductivity is added thereto at the concentration range from $1 \times 10^{18}$ to $1 \times 10^{20}$ atoms/cm³.

Here, the region having the same concentration range as the fifth impurity regions is referred to as a p⁻ region.

Through the above steps, an impurity region having the n-type or p-type conductivity is formed in each semiconductor layer. The conductive layers 804 to 807 become the gate electrodes of TFTs.

An insulating is formed to cover almost the entire surface (not shown). In this example, the silicon oxide film having 50 nm in thickness is formed by plasma CVD method. Of course, the insulating film is not limited to a silicon oxide film and a single layer or laminate of other insulating films containing silicon may be used.

The next step is activation treatment of the impurity elements used to dope the respective semiconductor layers. The activation step employs rapid thermal annealing (RTA) using a lamp light source, irradiation of a laser, heat treatment using a furnace, or a combination of these methods.

This example shows an example that the insulating film is formed before the above-described activation. However, the insulating film may be formed after the activation.

The first interlayer insulating film 808 made from a silicon nitride film is formed. Then, the semiconductor layers are subjected to heat treatment (at 300 to 550° C. for 1 to 12 hours) to hydrogenate the semiconductor layers. This step is for terminating dangling bonds in the semiconductor layers using hydrogen contained in the first interlayer insulating film 808. The semiconductor layers can be hydrogenated irrespective of the presence of the insulating film made from a silicon oxide film (not shown in a figure). Other hydrogenation methods employable include plasma hydrogenation (using hydrogen excited by plasma).

Next, a second interlayer insulating film 809a is formed on the first interlayer insulating film 808 from an organic insulating material or an inorganic insulating material. In this example, an acrylic resin film 809a is formed to have a thickness of 1.6 μm.

Formed next are contact holes reaching the conductive layers that serve as the gate electrodes or gate wires and contact holes reaching the respective impurity regions. In this example, etching treatment is conducted several times in succession. Also, in this example, the first interlayer insulating film is used as an etching stopper to etch the second interlayer insulating film, and then the first interlayer insulating film is etched. Thereafter, electrodes 835 to 841, specifically, a source wiring, a power supply line, a lead-out electrode, a connection electrode, etc. are formed from Al, Ti, Mo, W, etc. Here, the electrodes and wirings are obtained by patterning a laminate of a Ti film (100 nm in thickness), an Al film containing silicon (350 nm in thickness), and another Ti film (50 nm in thickness). The source electrode, the source wiring, the connection electrode, the lead-out electrode, the power supply line, and the like are thus formed as needed. A lead-out electrode for the contact with a gate wiring covered with an interlayer insulating film is provided at an end of the gate wiring, and other wirings also have at their ends input/output terminal portions having a plurality of electrodes for connecting to external circuits and external power supplies.

A driver circuit 902 having a CMOS circuit in which an n-channel TFT 905 and a p-channel TFT 906 are combined complementarily and a pixel portion 901 with a plurality of pixels each having an n-channel TFT 903 or a p-channel TFT 904 are formed in the manner described above.

Next, a third interlayer insulating film 809b made from an inorganic insulating material is formed on the second interlayer insulating film 809a. The silicon nitride film 809b with a thickness of 200 nm is formed by sputtering here. Alternatively, the silicon nitride film 809b may contain hydrogen, which is included in a reaction gas.

Next, the third interlayer insulating film 809b is etched, and then a contact hole is formed so as to reach the connection electrode 841 formed in contact with the drain region of the current control TFT 904 made from a p-channel TFT. A pixel electrode 834 is formed so as to contact and overlap with the connection electrode 841. In this example, the pixel electrode 834 is made from a material having a large work function, specifically, such as platinum (Pt), chrome (Cr), tungsten (W) and nickel (Ni) with a thickness of 0.1 to 1 μm in order to make the pixel electrode 834 function as an anode of an organic light emitting element.

An inorganic insulator 842 is formed on each end of the pixel electrode 834 so as to cover the each end of the pixel electrode 834. It is preferable that the inorganic insulator 842 is formed from an insulating film containing silicon by sputtering and then patterned. In addition to that, the inorganic insulator 842 may contain hydrogen which is included in the reaction gas. Further, a bank formed from an organic insulator may be formed for as a substitute for the inorganic insulator 842.

Next, an EL layer 843 and the cathode 844 of the organic light emitting element are formed on the pixel electrode 834 whose ends are covered by the inorganic insulator 842. In this example, the EL layer 843 may be formed by ink jet method, evaporation, spin coating method and the like.

An EL layer 843 (a layer for light emission and for moving of carriers to cause light emission) may be formed by freely combining a light emitting layer, an electric charge transporting layer and an electric charge injection layer. For example, a low molecular weight organic EL material or a high molecular weight organic EL material is used to form an EL layer. An EL layer may be a thin film formed of a light emitting material that emits light by singlet excitation (fluorescence) (a singlet compound) or a thin film formed of a light emitting material that emits light by triplet excitation (phosphorescence) (a triplet compound). Inorganic materials such as silicon carbide may be used for the electric charge transporting layers and electric charge injection layers. Known organic EL materials and inorganic materials can be employed.

Moreover, it is considered to be preferable that as a material used for a cathode 844, a metal whose work function is small (representatively, metal elements belonging to 1 Group or 2 Group of the periodic table) and an alloy containing these are used. Since the smaller the work function is, the more the light emitting efficiency is enhanced, it is preferable that among these, as a material used for a cathode, an alloy such as MgAg, MgIn or AlLi or after the film that has been formed with elements belonging to Group 1 or Group 2 of the periodic table by co-vapor deposition or the like was formed in a thin film, it is made a laminated layer structure in which a transparent conductive film (ITO (indium tin oxide alloy), indium oxide-zinc oxide alloy ($In_2O_3$—ZnO), zinc oxide (ZnO) and the like) has been formed.

Subsequently, a protective film 846 for covering the cathode 844 is formed. For the protective film 846, an insulating film whose major component is silicon nitride or silicon oxynitride may be formed by a sputtering method, as shown in Embodiment 2, for the purpose that the drawback in the EL layer is terminated with hydrogen, it is preferable that a film 845 containing hydrogen is provided on the cathode 844.

As the film 845 containing hydrogen, an insulating film whose major component is carbon or silicon nitride may be formed by a PCVD method, upon the formation of the film, the drawback in the organic compound layer can be terminated with hydrogen which has been made plasmatic. Moreover, the drawback in the organic compound layer can be terminated with hydrogen by diffusing hydrogen from the above-described film containing hydrogen by means of performing the heating treatment in the temperature range where the organic compound layer is durable and by means of utilizing the heat generation generated at the time when the light emitting element emits the light.

Moreover, the protective film 846 and the film 845 containing hydrogen prevent the materials for promoting the deterioration caused by the oxidization of the EL layer, that is, moisture, oxygen and the like from invading from the exterior. However, the protective film, the film containing hydrogen and the like may not be provided in the input and output terminal section necessary to be connected to FPC later.

The stage where the steps so far were terminated is shown in FIG. 12. It should be noted that in FIG. 12, a switching TFT 903 and a TFT for supplying the current to an organic light emitting element (TFT for controlling current 904) are shown, however a variety of circuits consisting of a plurality of TFTs and the like may be provided beyond the gate electrode of the relevant TFT. Needless to say, it is not particularly limited.

Subsequently, it is preferable that the organic light emitting element is completely interrupted by encapsulating the organic light emitting element having at least a cathode, an organic compound layer and an anode with a sealing substrate or a sealing can, thereby preventing the materials such as moisture, oxygen and the like promoting the deterioration caused by the oxidization of the EL layer from invading from the exterior. It is preferable that the degassing is carried out by performing the annealing under the vacuum immediately before it is encapsulated with the sealing substrate or the sealing can. Moreover, it is preferable that at the time when the sealing substrate is pasted, it is performed under the atmosphere containing hydrogen and an inert gas (rare gas or nitrogen) and hydrogen is contained in the space sealed with sealing. The drawback in the organic compound layer can be terminated with hydrogen by diffusing hydrogen from the above-described space containing hydrogen by means of utilizing the heat generation generated at the time when the light emitting element emits the light. Terminating the drawback in the organic compound layer with hydrogen, the reliability for a light emitting device is enhanced.

Subsequently, a FPC (flexible print circuit) is pasted on the respective electrodes of the input and output terminal section with an anisotropic conductive material. An anisotropic conductive material is composed of a resin and a conductive particle having a diameter of several tens to several hundreds μm whose surface has been plated with Au or the like, and the respective electrodes of the input and output terminal section and the wirings formed in the FPC are electrically connected each other with the conductive particle.

Moreover, color filters corresponding to the respective pixels are provided on the sealing substrate. The circularly polarized plate is not needed by providing the color filters. Furthermore, if it is necessary, the other optical film may be provided. Moreover, IC chip or the like may be mounted.

Moreover, using the fabrication unit shown in FIG. 6 or FIG. 7, according to Embodiment 4, a light emitting device can be prepared with an excellent throughput.

A module type light emitting device to which a FPC has been connected is completed by the above-described steps.

Moreover, the present Example can be freely combined with Embodiment 1, Embodiment 2, Embodiment 3, Embodiment 4 or Embodiment 5.

Example 2

Example 1 was an example in which a cathode is made transparent conductive film, the emission is taken out in the direction of the arrow shown in FIG. 4A or FIG. 4B. However, the configuration (FIG. 4C) in which the emission is performed in the contrary direction to the direction shown in FIG. 4A or FIG. 4B may be also available. In the present Example, the configuration in which the light is emitted in the direction contrary to that of Example 1 is shown. However, since these are approximately the same with each other except that the material of the anode and the material of the cathode are different, here the description in detail is omitted.

In the present Example, as an anode, a transparent conductive film (ITO (indium tin oxide alloy), indium oxide-zinc oxide alloy ($In_2O_3$—ZnO), zinc oxide (ZnO) and the like) is used.

Moreover, as a cathode, an alloy film having the film thickness of 80 nm-200 nm, representatively, an alloy such as MgAg, MgIn, AlLi and the like or a film formed with elements belonging to Group 1 or Group 2 of the periodic table and aluminum by a co-vapor deposition method is used.

In this way, the emission can be made in the direction of the arrow shown in FIG. 4C.

The present Example is the same with Example 1 except for the above-described points.

Moreover, using the fabrication unit shown in FIG. 6 or FIG. 7 similar to Example 1, according to Embodiment 4, a light emitting device can be prepared with an excellent throughput.

Moreover, in Example 1, by making an pixel electrode cathode, an organic compound layer and an anode are laminated, and the emission may be made in the reverse direction to that of Example 1. In this case, it is desired that a TFT connected to the pixel electrode is made n-channel type TFT.

Moreover, the present Example can be freely combined with Embodiment 1, Embodiment 2, Embodiment 3, Embodiment 4, Embodiment 5 or Example 1.

Example 3

By implementing the present invention, EL modules (active matrix EL module and passive EC module) can be completed. Namely, by implementing the present invention, all of the electronic equipments into which the various modules are built are completed. Following can be given as such electronic equipment video cameras; digital cameras; head mounted displays (goggle type displays); car navigation systems; car stereos; personal computers; portable information terminals (mobile computers, mobile phones, electronic books etc.) etc. Examples of these are shown in FIGS. 13A to 13F and 14A to 14C.

Figure 13A:
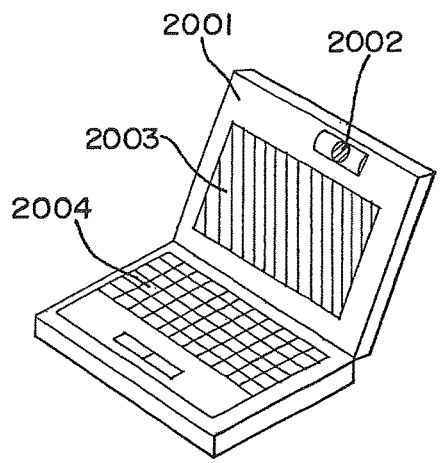
FIGS. 13A to 13F are diagrams showing examples of electronic devices.

FIG. 13A is a personal computer which comprises: a main body 2001; an image input section 2002; a display section 2003; and a keyboard 2004 etc.

Figure 13B:
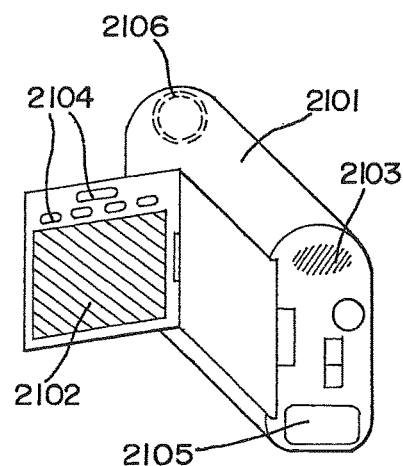

FIG. 13B is a video camera which comprises: a main body 2101; a display section 2102; a voice input section 2103; operation switches 2104; a battery 2105 and an image receiving section 2106 etc.

Figure 13C:
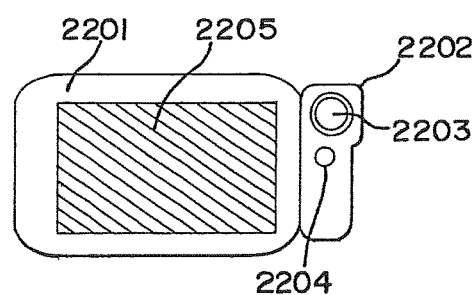

FIG. 13C is a mobile computer which comprises: a main body 2201; a camera section 2202; an image receiving section 2203; operation switches 2204 and a display section 2205 etc.

Figure 13D:
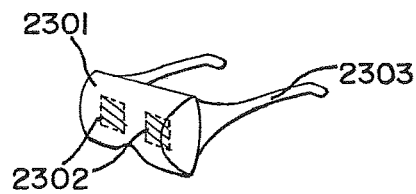

FIG. 13D is a goggle type display which comprises: a main body 2301; a display section 2302; and an arm section 2303 etc.

Figure 13E:
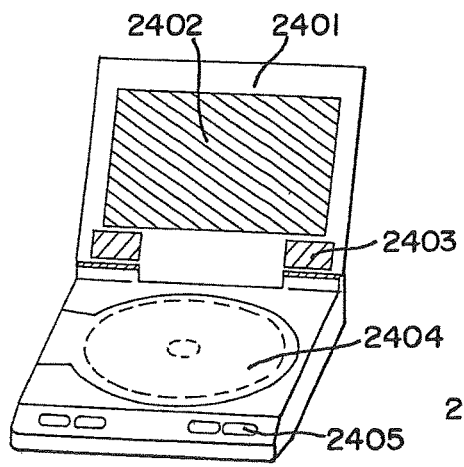

FIG. 13E is a player using a recording medium in which a program is recorded (hereinafter referred to as a recording medium) which comprises: a main body 2401; a display section 2402; a speaker section 2403; a recording medium 2404; and operation switches 2405 etc. This apparatus uses DVD (digital versatile disc), CD, etc. for the recording medium, and can perform music appreciation, film appreciation, games and use for Internet.

Figure 13F:
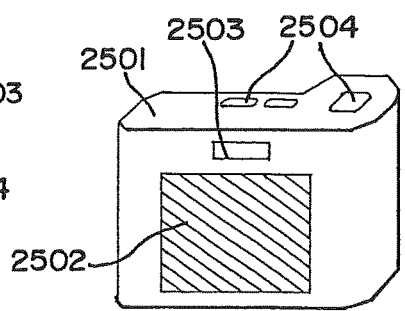

FIG. 13F is a digital camera which comprises: a main body 2501; a display section 2502; a view finder 2503; operation switches 2504; and an image receiving section (not shown in the figure) etc.

Figure 14A:
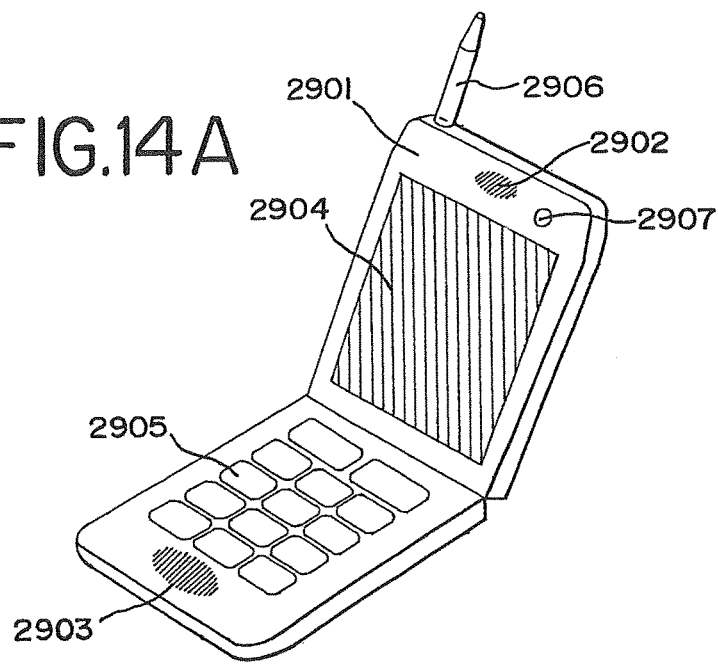
FIGS. 14A to 14C are diagrams showing examples of electronic devices.

FIG. 14A is a mobile phone which comprises: a main body 2901; a voice output section 2902; a voice input section 2903; a display portion 2904; operation switches 2905; an antenna 2906; and an image input section (CCD, image sensor, etc.) 2907 etc.

Figure 14B:
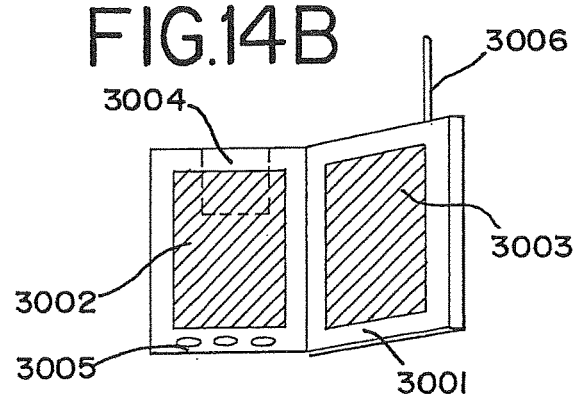
Figure 14C:
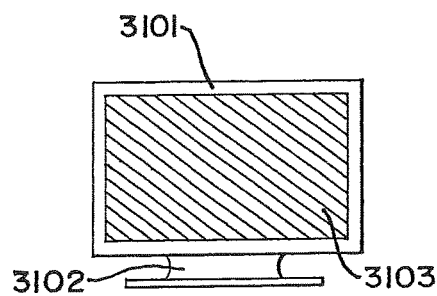

FIG. 14B is a portable book (electronic book) which comprises: a main body 3001; display portions 3002 and 3003; a recording medium 3004; operation switches 3005 and an antenna 3006 etc. FIG. 14C is a display which comprises: a main body 3101; a supporting section 3102; and a display portion 3103 etc.

In addition, the display shown in FIG. 14C has small and medium-sized or large-sized screen, for example a size of 5 to 20 inches. Further, to manufacture the display part with such sizes, it is preferable to mass-produce by executing a multiple pattern using a substrate sized 1×1 m.

As described above, the applicable range of the present invention is extremely large, and the invention can be applied to the electronic equipment of various areas. Note that the electronic devices of this example can be achieved by utilizing any combination of constitutions in Embodiments 1 to 5 and Examples 1 to 2.

According to the present invention, since the drawback in an organic compound layer can be terminated with hydrogen, the reliability and the brightness of a light emitting device are enhanced.

Moreover, according to the present invention, since a very expensive circularly polarized film can be made unnecessary, the reduction of the manufacturing cost can be realized.

Moreover, according to the present invention, without being dependent upon the film formation method and deposition precision of an organic compound layer, a high definition, a high aperture ratio and a high reliability can be realized for a flat panel display of full colors using the emission colors of red, green and blue.

What is claimed is:
1. A light emitting device comprising:
 a transistor;
 a first electrode electrically connected to the transistor;
 an insulator covering an end portion of the first electrode;
 a second electrode in contact with the insulator;
 a first light emitting layer and a second light emitting layer over the second electrode;
 a third electrode over the first light emitting layer, the second light emitting layer and the second electrode; and
 a terminal portion comprising a wiring,
 wherein the first light emitting layer is electrically connected to the first electrode,
 wherein the third electrode is electrically connected to the second electrode, and
 wherein the second electrode is electrically connected to the wiring.
2. The light emitting device according to claim 1, further comprising a silicon nitride layer, wherein the silicon nitride layer is provided over and in direct contact with the thin electrode.

3. The light emitting device according to claim 1, further comprising an insulating layer over the transistor, wherein the insulating layer comprises an organic resin.

4. The light emitting device according to claim 1, further comprising an insulating layer over the transistor, wherein the insulating layer comprises an acrylic resin.

5. The light emitting device according to claim 1,
wherein the first light emitting layer comprises a first organic compound, and
wherein the second light emitting layer comprises a second organic compound.

6. The light emitting device according to claim 1,
wherein the first light emitting layer and the second light emitting layer are separated from each other with a gap over the insulator.

7. The light emitting device according to claim 1,
wherein the second light emitting layer is provided over the first electrode.

8. A display module comprising the light emitting device according to claim 1 and an FPC.

9. An electronic apparatus comprising the light emitting device according to claim 1 and at least one of an antenna, a battery, and an operation switch.

10. A light emitting device comprising:
a first substrate;
a transistor over the first substrate;
a first electrode electrically connected to the transistor;
an insulator covering an end portion of the first electrode;
a second electrode in contact with the insulator;
a first light emitting layer and a second light emitting layer over the second electrode;
a third electrode over the first light emitting layer, the second light emitting layer and the second electrode;
a terminal portion comprising a wiring;
a second substrate over the third electrode and the terminal portion; and
a sealing member between the first substrate and the second substrate,
wherein the first light emitting layer is electrically connected to the first electrode,
wherein the third electrode is electrically connected to the second electrode,
wherein the second electrode is electrically connected to the wiring, and
wherein the sealing member is provided over the wiring.

11. The light emitting device according to claim 10, further comprising a silicon nitride layer, wherein the silicon nitride layer is provided over and in direct contact with the third electrode.

12. The light emitting device according to claim 10, further comprising an insulating layer over the transistor, wherein the insulating layer comprises an organic resin.

13. The light emitting device according to claim 10, further comprising an insulating layer over the transistor, wherein the insulating layer comprises an acrylic resin.

14. The light emitting device according to claim 10,
wherein the first light emitting layer comprises a first organic compound, and
wherein the second light emitting layer comprises a second organic compound.

15. The light emitting device according to claim 10,
wherein the first light emitting layer and the second light emitting layer are separated from each other with a gap over the insulator.

16. The light emitting device according to claim 10,
wherein the second light emitting layer is provided over the first electrode.

17. A display module comprising the light emitting device according to claim 10 and an FPC.

18. An electronic apparatus comprising the light emitting device according to claim 10 and at least one of an antenna, a battery, and an operation switch.

* * * * *

UNITED STATES PATENT AND TRADEMARK OFFICE
CERTIFICATE OF CORRECTION

| | | |
|---|---|---|
| PATENT NO. | : 9,653,519 B2 | Page 1 of 1 |
| APPLICATION NO. | : 14/989195 | |
| DATED | : May 16, 2017 | |
| INVENTOR(S) | : Shunpei Yamazaki et al. | |

It is certified that error appears in the above-identified patent and that said Letters Patent is hereby corrected as shown below:

In the Specification

Column 1, Line 18; Change "alight" to --a light--.

Column 1, Line 48; Change "devices, in" to --devices in--.

Column 2, Line 11; Change "(fluorescence))," to --(fluorescence),--.

Column 2, Line 29; Change "alight" to --a light--.

Column 4, Line 20; Change "thin (DLC" to --thin film (DLC--.

Column 27, Line 27; Change "film, here" to --film here--.

Column 33, Line 44; Change "equipment video" to --equipment:   video--.

In the Claims

Column 34, Line 66, Claim 2; Change "thin" to --third--.

Signed and Sealed this
Fifth Day of September, 2017

Joseph Matal
Performing the Functions and Duties of the
Under Secretary of Commerce for Intellectual Property and
Director of the United States Patent and Trademark Office